(12) United States Patent
Su et al.

(10) Patent No.: US 10,804,315 B2
(45) Date of Patent: *Oct. 13, 2020

(54) ABSORPTION ENHANCEMENT STRUCTURE FOR IMAGE SENSOR

(71) Applicant: Taiwan Semiconductor Manufacturing Co., Ltd., Hsin-Chu (TW)

(72) Inventors: Ching-Chung Su, Tainan (TW); Hung-Wen Hsu, Tainan (TW); Jiech-Fun Lu, Madou Township (TW); Shih-Pei Chou, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,627

(22) Filed: Nov. 25, 2019

(65) Prior Publication Data
US 2020/0091223 A1 Mar. 19, 2020

Related U.S. Application Data

(60) Continuation of application No. 16/420,576, filed on May 23, 2019, now Pat. No. 10,510,799, which is a
(Continued)

(51) Int. Cl.
*H01L 27/146* (2006.01)

(52) U.S. Cl.
CPC .... *H01L 27/14685* (2013.01); *H01L 27/1462* (2013.01); *H01L 27/1463* (2013.01);
(Continued)

(58) Field of Classification Search
CPC ......... H01L 27/14685; H01L 27/14627; H01L 27/1463; H01L 27/1462; H01L 27/14643;
(Continued)

(56) References Cited

U.S. PATENT DOCUMENTS

| 5,744,827 A | 4/1998 | Jeong et al. |
| 7,759,755 B2 | 7/2010 | Adkisson et al. |

(Continued)

FOREIGN PATENT DOCUMENTS

| JP | 2013183073 A | 9/2013 |
| KR | 100749263 A | 8/2007 |
| WO | 2016024946 A1 | 2/2016 |

OTHER PUBLICATIONS

Mayonado, et al. "Investigation of the Bragg-Snell Law in Photonic Crystals." 2015 BFY Proceedings. Edited by Eblen-Zayas, Behringer, and Kozminski; Peer-reviewed, doi:10.1119/bfy.2015.pr.015.
(Continued)

*Primary Examiner* — Caleen O Sullivan
(74) *Attorney, Agent, or Firm* — Eschweiler & Potashnik, LLC

(57) ABSTRACT

The present disclosure, in some embodiments, relates to method of forming an integrated chip. The method may be performed by forming an image sensing element within a substrate. A dry etching process is performed on the substrate to form a plurality of intermediate protrusions defined by the substrate. A wet etching process is performed on the plurality of intermediate protrusions to form a plurality of protrusions from the plurality of intermediate protrusions.

20 Claims, 17 Drawing Sheets

Related U.S. Application Data continuation of application No. 16/190,608, filed on Nov. 14, 2018, now Pat. No. 10,304,898, which is a division of application No. 15/597,452, filed on May 17, 2017, now Pat. No. 10,163,974.

(52) U.S. Cl.
CPC .... *H01L 27/1464* (2013.01); *H01L 27/14621* (2013.01); *H01L 27/14627* (2013.01); *H01L 27/14643* (2013.01); *H01L 27/14689* (2013.01)

(58) Field of Classification Search
CPC ......... H01L 27/14621; H01L 27/14689; H01L 27/1464
USPC .......................................................... 257/437
See application file for complete search history.

(56) References Cited

U.S. PATENT DOCUMENTS

| | | | |
|---|---|---|---|
| 7,880,207 | B2 | 2/2011 | Fertig et al. |
| 10,043,970 | B2 | 8/2018 | Chuang et al. |
| 10,157,944 | B2 | 12/2018 | Huang et al. |
| 10,163,974 | B2 * | 12/2018 | Su ..................... H01L 27/14621 |
| 10,304,898 | B2 | 5/2019 | Su |
| 2001/0005018 | A1 | 6/2001 | Oh |
| 2002/0024058 | A1 | 2/2002 | Marshall |
| 2004/0161865 | A1 | 8/2004 | Yu |
| 2005/0133723 | A1 | 6/2005 | Lee |
| 2007/0072409 | A1 | 3/2007 | Ulmer et al. |
| 2008/0164606 | A1 | 7/2008 | Greisen et al. |
| 2009/0008735 | A1 | 1/2009 | Ogino |
| 2009/0014751 | A1 | 1/2009 | Kim et al. |
| 2010/0001405 | A1 | 1/2010 | Williamson et al. |
| 2010/0038801 | A1 | 2/2010 | Gu |
| 2010/0267184 | A1 | 10/2010 | Noh |
| 2010/0302424 | A1 | 12/2010 | Yamaguchi |
| 2011/0001038 | A1 | 1/2011 | Tseng et al. |
| 2011/0012222 | A1 | 1/2011 | Cho |
| 2011/0089517 | A1 | 4/2011 | Venezia et al. |
| 2011/0240997 | A1 | 10/2011 | Rockenberger et al. |
| 2012/0003787 | A1 | 1/2012 | Tanaka |
| 2012/0068355 | A1 | 3/2012 | Aoki et al. |
| 2012/0273907 | A1 | 11/2012 | Lim |
| 2012/0326248 | A1 | 12/2012 | Daneman et al. |
| 2013/0027073 | A1 | 1/2013 | Pagani et al. |
| 2013/0052760 | A1 | 2/2013 | Cho |
| 2013/0330846 | A1 | 12/2013 | Tang |
| 2013/0341746 | A1 | 12/2013 | Ting et al. |
| 2014/0020752 | A1 | 1/2014 | Arimoto |
| 2014/0177081 | A1 | 6/2014 | Sugishima et al. |
| 2014/0253768 | A1 | 9/2014 | Li |
| 2014/0353828 | A1 | 12/2014 | Edelstein et al. |
| 2015/0028493 | A1 | 1/2015 | Nakamura et al. |
| 2015/0279885 | A1 | 10/2015 | Tu et al. |
| 2015/0287761 | A1 | 10/2015 | Huang et al. |
| 2016/0181104 | A1 | 6/2016 | Schmidt |
| 2016/0181228 | A1 | 6/2016 | Higuchi et al. |
| 2016/0343532 | A1 | 11/2016 | Chuang |
| 2017/0110493 | A1 | 4/2017 | Yokogawa |
| 2017/0288070 | A1 | 10/2017 | Tracy |
| 2018/0350853 | A1 | 12/2018 | Huang et al. |

OTHER PUBLICATIONS

Xu, et al. "Electronic Band Structure and Optical Properties of Silicon Nanoporous Pillar Array." Physica E41(2009) 1882-1885, published Aug. 25, 2009.

Zimmermann, H. "Integrated Silicon Optoelectronics." Chapter 1—Basics of Optical Emission and Absorption. 2010, XX, 386 p. 321 illus., 6 illus. In color., Hardcover. ISBN: 978-3-642-01520-5.

Heiman, D. "Photoluminescence Spectroscopy." Physics U600, Adv Lab I—Physics of Waves and Optics—Summer 2004, Northeastern University, Jun. 1, 2004.

Li, et al. "Broadband Infrared Photoluminescence in Silicon Nanowires with High Density Stacking Faults." Nanoscale, 2015, 7, 1601.

Wilamowski, et al. "Fundamentals of Industrial Electronics." Chapter 9—Bipolar Junction Transistor. Published Mar. 4, 2011. ISBN 9781439802793.

Sun, et al. "Delay Time Constant Analysis for Ft Optimization in RF Si/SiGe Bipolar Devices." IEEE article. ISBN 0-7803-7749-4, published in 2003.

Wang, et al. "Light Trapping in Photonic Crystals." Energy Environ. Sci., 2014, 7, 2725-2738.

Gong, et al. "Photonic Crystals: Principals and Applications." Published Dec. 10, 2013. International Standard Book No. 13: 978-981-4364-83-6 (eBook—PDF).

Cressler, et al. "SiGe HBT Technology: A New Contender for Si-Based RF and Microwave Circuit Applications." IEEE Transactions on Microwave Theory and Techniques, vol. 46, No. 5, May 1998.

Tubert, et al. "High Speed Dual Port Pinned-photodiode for Time-Of-Flight Imaging." 2009 International Image Sensor Workshop, Bergen, Norway, Jun. 22-28, 2009.

Watts, Anthony. A Window on Water Vapor and Planetary Temperature. Published on Jun. 18, 2008. Retrieved from https://wattsupwiththat.com/2008/06/18/a-window-on-water-vapor-and-planetary-temperature/ on May 15, 2017.

Kaufmann, et al. "Near Infrared Image Sensor with Integrated Germanium Photodiodes." Journal of Applied Physics • Jul. 2011.

Bob, et al. "Fabrication and Subband Gap Optical Properties of Silicon Supersaturated with Chalcogens by Ion Implantation and Pulsed Laser Melting." Journal of Applied Physics 107, 123506 (2010).

Liu, Jia-Ming. "Photonic Devices." Chapter 14—Lecture 12: Photodiode Detectors. Published online Jan. 2010, ISBN # 9780511614255.

U.S. Appl. No. 15/609,325, filed May 31, 2017.

Non-Final Office Action in connection with U.S. Appl. No. 15/449,284.

Notice of Allowance in connection with U.S. Appl. No. 15/449,284.

Non-Final Office Action in connection with U.S. Appl. No. 15/609,325.

Non-Final Office Action dated Oct. 18, 2018 in connection with related U.S. Appl. No. 15/665,495.

Non-Final Office Action dated Apr. 13, 2018 for U.S. Appl. No. 15/597,452.

Notice of Allowance dated Sep. 7, 2018 for U.S. Appl. No. 15/597,452.

Notice of Allowance dated Feb. 27, 2019 in connection with U.S. Appl. No. 15/609,325.

Final Office Action dated Mar. 7, 2019 in connection with U.S. Appl. No. 15/665,495.

Notice of Allowance dated Apr. 4, 2019 for U.S. Appl. No. 16/190,608.

Notice of Allowance dated Jun. 12, 2019 in connection with U.S. Appl. No. 15/665,495.

Non-Final Office Action dated Aug. 13, 2019 in connection with U.S. Appl. No. 16/127,322.

Non-Final Office Action dated Sep. 26, 2019 in connection with U.S. Appl. No. 16/420,576.

Notice of Allowance dated Oct. 29, 2019 in connection with U.S. Appl. No. 16/420,576.

Notice of Allowance dated Nov. 29, 2019 in connection with U.S. Appl. No. 16/127,322.

Non Final Office Action dated Jun. 17, 2020 in connection with U.S. Appl. No. 16/541,499.

\* cited by examiner

ABSORPTION ENHANCEMENT STRUCTURE FOR IMAGE SENSOR

REFERENCE TO RELATED APPLICATIONS

This application is a Continuation of U.S. application Ser. No. 16/420,576 filed on May 23, 2019, which is a Continuation of U.S. application Ser. No. 16/190,608, filed on Nov. 14, 2018 (now U.S. Pat. No. 10,304,898, issued on May 28, 2019), which is a Divisional of U.S. application Ser. No. 15/597,452, filed on May 17, 2017 (now U.S. Pat. No. 10,163,974, issued on Dec. 25, 2018). The contents of the above-referenced patent applications are hereby incorporated by reference in their entirety.

BACKGROUND

Integrated circuits (IC) with image sensors are used in a wide range of modern day electronic devices, such as cameras and cell phones, for example. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
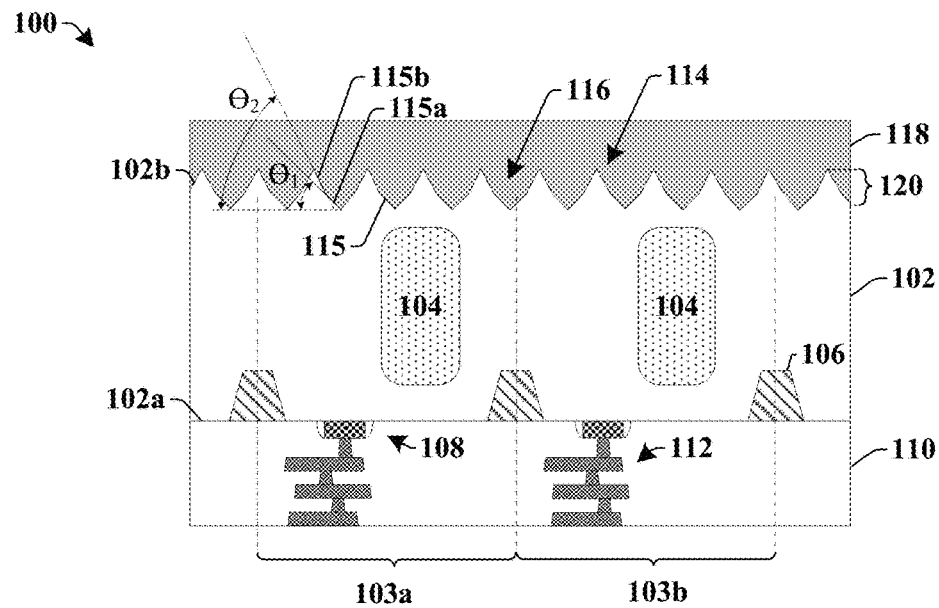
FIG. 1 illustrates a cross-sectional view of some embodiments of an image sensor integrated chip comprising an absorption enhancement structure configured to improve a quantum efficiency of an image sensor within the integrated chip.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors (CIS) typically comprise an array of pixel regions, which respectively have an image sensing element arranged within a semiconductor substrate. Color filters are arranged over the image sensing elements and are configured to filter incident light provided to different image sensing elements within the CIS. Upon receiving light, the image sensing elements are configured to generate electric signals corresponding to the received light. The electric signals from the image sensing elements can be processed by a signal processing unit to determine an image captured by the CIS.

Quantum efficiency (QE) is a ratio of the number of photons that contribute to an electric signal generated by an image sensing element within a pixel region to the number of photons incident on the pixel region. It has been appreciated that the QE of a CIS can be improved with on-chip absorption enhancement structures. For example, an absorption enhancement structure comprising protrusions arranged along a surface of a substrate can increase absorption by decreasing the reflection of incident radiation. Such protrusions are typically formed using a dry etching process. However, the dry etching process used to form the protrusions can result in plasma damage along outer edges of the protrusions. The plasma damage can lead to defects (e.g., interstitials) in a crystalline structure of the substrate, which can cause an increase in dark current and/or white pixel number. The increase in dark current and/or white pixel number causes charges to accumulate within an image sensing element when light is not impingent on the image sensing element, thereby becoming a major source of noise that can degrade image quality of a CIS.

The present disclosure relates to a method of forming an absorption enhancement structure on a substrate having an image sensing element, and an associated apparatus. The method reduces crystalline defects resulting from plasma damage sustained by the substrate during fabrication of the absorption enhancement structure. In some embodiments, the method may be performed by forming a patterned masking layer over a first side of a substrate. A dry etching process is performed on the first side of the substrate according to the patterned masking layer to define a plurality of intermediate protrusions arranged along the first side of the substrate within a periodic pattern. A wet etching process is performed on the plurality of intermediate protrusions to form a plurality of protrusions. One or more absorption enhancement layers are subsequently formed over and between the plurality of protrusions. The wet etching process removes a region of the plurality of intermediate protrusions that is damaged by the dry etching process and that can negatively impact performance of an image sensing element within the substrate.

FIG. 1 illustrates a cross-sectional view of some embodiments of an image sensor integrated chip 100 comprising an absorption enhancement structure configured to improve a quantum efficiency (QE) of an image sensing element within the integrated chip.

The image sensor integrated chip 100 comprises a substrate 102 having a plurality of pixel regions 103a-103b. The plurality of pixel regions 103a-103b respectively comprise an image sensing element 104 configured to convert incident radiation (e.g., photons) into an electric signal (i.e., to generate electron-hole pairs from the incident radiation). In some embodiments, the image sensing element 104 may comprise a photodiode. Isolation structures 106 (e.g., shallow trench isolation structures, deep trench isolation structures, isolation implants, etc.) may be arranged within the substrate 102 at locations between adjacent ones of the plurality of pixel regions 103a-103b.

A plurality of transistor devices 108 are arranged along a first side 102a of the substrate 102. A back-end-of-the-line (BEOL) metallization stack is also arranged along the first side 102a of the substrate 102. The BEOL metallization stack comprises a dielectric structure 110 surrounding a plurality of conductive interconnect layers 112. The dielectric structure 110 comprises a plurality of stacked inter-level dielectric (ILD) layers. The plurality of conductive interconnect layers 112 comprise alternating layers of conductive vias and conductive wires, which are electrically coupled to the plurality of transistor devices 108.

A second side 102b of the substrate 102 comprises a non-planar surface defining a plurality of protrusions 114 arranged in a periodic pattern. The plurality of protrusions 114 are laterally separated from one another by recesses 116 within the second side 102b of the substrate 102. In some embodiments, the plurality of protrusions 114 may comprise angled sidewalls 115 respectively comprising a first segment 115a having a first sidewall angle $\Theta_1$ (or slope) and a second segment 115b overlying the first segment 115a and having a second sidewall angle $\Theta_2$ (or slope) that is larger than the first sidewall angle $\Theta_1$ (or slope). In some embodiments, the first sidewall angle $\Theta_1$ may be in a range of between approximately 45° and approximately 55°. In some embodiments, the second sidewall angle $\Theta_2$ may be in a range of between approximately 75° and approximately 90°.

One or more absorption enhancement layers 118 are arranged over the plurality of protrusions 114 and within the recesses 116. One of the one or more absorption enhancement layers 118 contact the substrate 102 along the non-planar surface to define an absorption enhancement structure 120 having an interface with a topography that increases absorption of radiation by the substrate 102 (e.g., by reducing a reflection of radiation from the non-planar surface). Increasing absorption of radiation by the substrate 102 increases a quantum efficiency (QE) of the image sensing element 104, and thereby improves performance of the image sensor integrated chip 100.

Figure 2A:
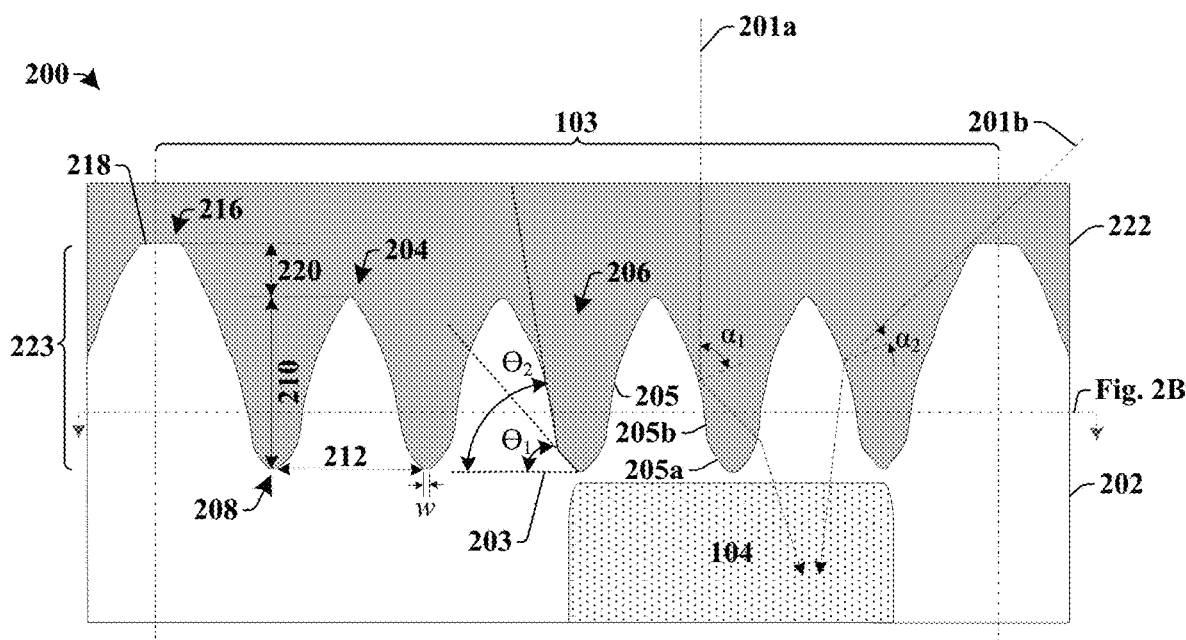
FIGS. 2A-2C illustrate some additional embodiments of an image sensor integrated chip comprising an absorption enhancement structure.
Figure 2B:
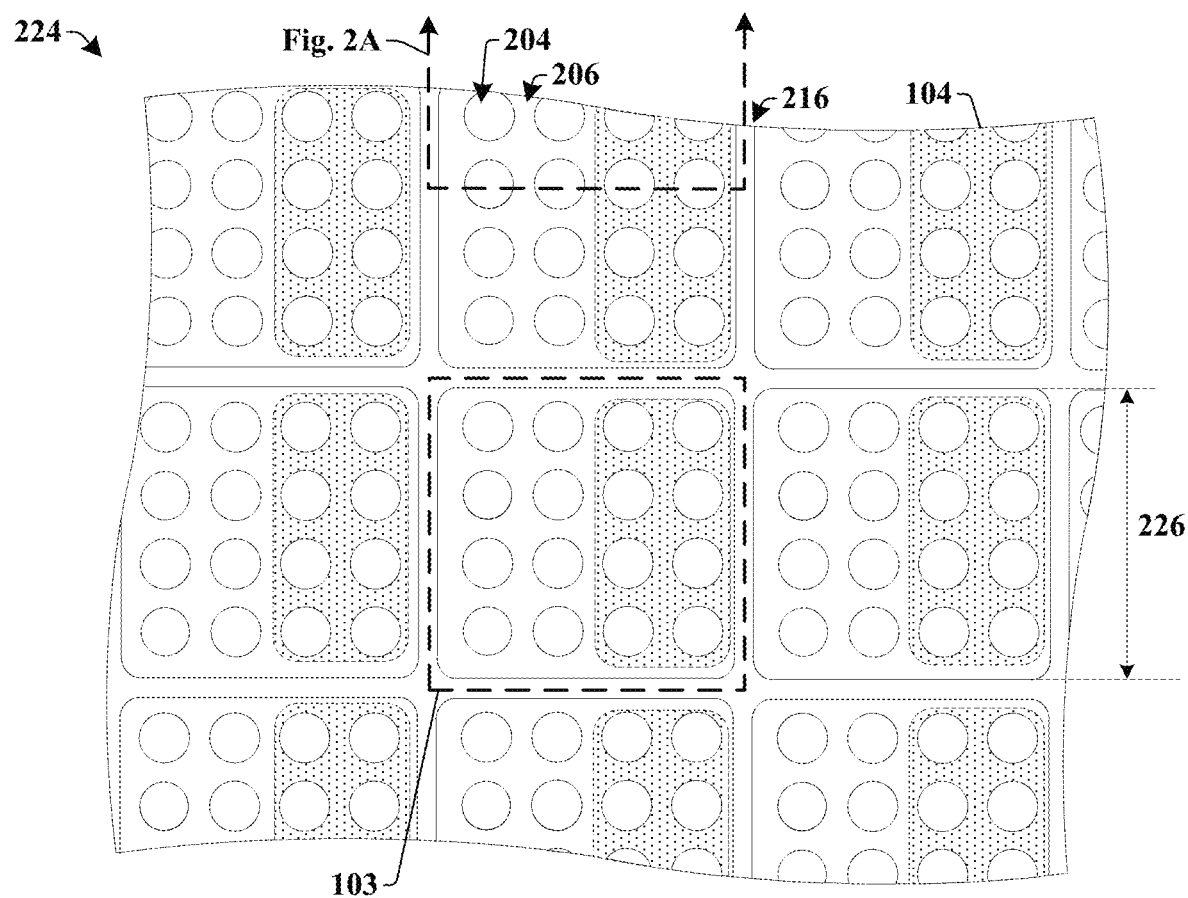
Figure 2C:
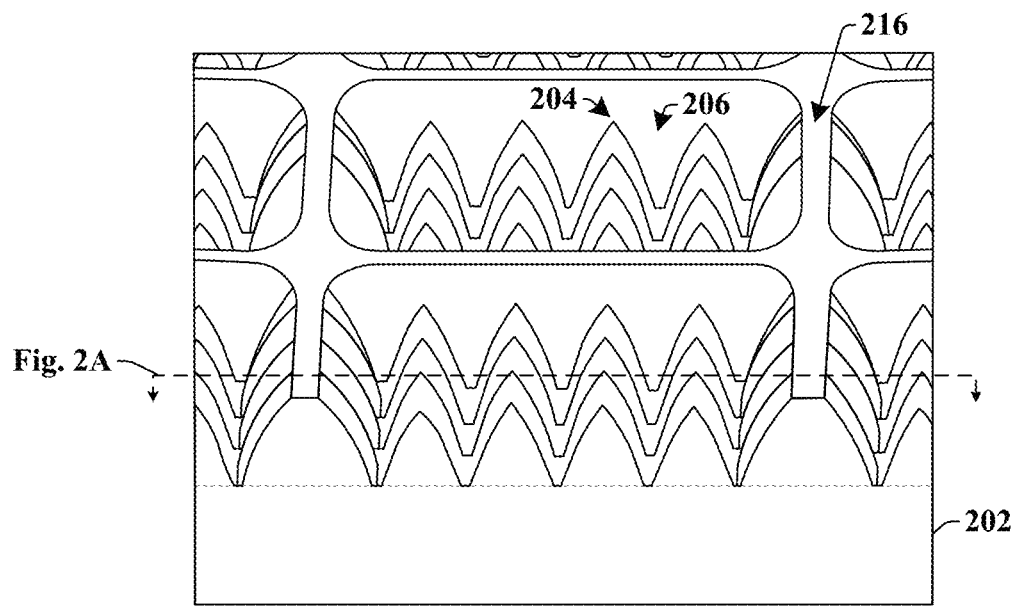

FIGS. 2A-2C illustrate some additional embodiments of an image sensor integrated chip comprising an absorption enhancement structure. FIG. 2A illustrates a cross-sectional view 200 of an image sensor integrated chip comprising an absorption enhancement structure. FIG. 2B illustrates a top-view 224 of the image sensor integrated chip of FIG. 2A and FIG. 2C illustrates a three-dimensional view 228 of the image sensor integrated chip of FIG. 2A.

As shown in cross-sectional view 200, the image sensor integrated chip comprises a substrate 202 having a plurality of protrusions 204 arranged in a periodic pattern within a pixel region 103 comprising an image sensing element 104. The plurality of protrusions 204 comprise sidewalls 205 with a first segment 205a and a second segment 205b overlying the first segment 205a. The first segment 205a has a linear surface (e.g., along a crystalline plane) having a first sidewall angle $\Theta_1$ that is a first acute angle measured with respect to a plane 203 extending along bottoms of the plurality of protrusions 204. The second segment 205b has a second sidewall angle $\Theta_2$ that is a second acute angle measured with respect to the plane 203. The second sidewall angle $\Theta_2$ is larger than the first sidewall angle $\Theta_1$. In some embodiments, the plurality of protrusions 204 may comprise cones, conical cylinders, or pyramids (e.g., having an n-sided base, wherein n=3, 4, 5, 6, . . . ). In some embodiments, the plurality of protrusions 204 may have sidewalls that meet at a pinnacle of the protrusions 204.

The plurality of protrusions 204 are separated from one another by recesses 206 defined by the sidewalls 205. In some embodiments, the sidewalls 205 of adjacent ones of the plurality of protrusions 204 may intersect at a lowest point within respective ones of the recesses 206. In other embodiments, the recesses 206 may respectively have a bottom surface 208 arranged between the sidewalls 205. The bottom surface 208 may comprise a substantially flat surface or a curved surface directly coupled to a substantially linear surface of the first segment 205a of the sidewalls 205. In some embodiments, the bottom surface 208 may have a width w that is in a range of between approximately 0 nm and approximately 25 nm. In other embodiments, the bottom surface 208 has a width w that is in a range of between approximately 0 nm and approximately 15 nm. It has been appreciated that as a size of the bottom surface 208 decreases, the reflection of incident radiation 201a-201b decreases for radiation in visible and near infrared (NIR) regions of the electromagnetic spectrum.

The plurality of protrusions 204 have a height 210 and a width 212 (measured along largest dimensions of a protrusion). In some embodiments, an aspect ratio between the height 210 and the width 212 is in a range of between approximately 1 and approximately 1.25 (i.e., 1≤height/width≤1.25). In other embodiments, the aspect ratio may be in a range of between approximately 1 and approximately 1.2. In some embodiments, the height 210 may be in a range of between approximately 400 nm and approximately 600 nm and the width 212 may be in a range of between approximately 400 nm and approximately 500 nm. In other embodiments, the height 210 and the width 212 may be less than 400 nm.

One or more absorption enhancement layers 222 are arranged over the plurality of protrusions 204 and within the recesses 206. In some embodiments, the one or more absorption enhancement layers 222 may comprise a dielectric material (e.g., $SiO_2$). In other embodiments, the one or more absorption enhancement layers 222 may comprise a different material, such as a semiconductor material. The one or more absorption enhancement layers 222 define an absorption enhancement structure 223 comprising an interface having a topography that is configured to increase absorption of radiation by the image sensing element 104.

In some embodiments, the absorption enhancement structure 223 is configured to increase absorption of radiation by providing for a low reflection of radiation from the substrate 202 (e.g., a reflection of less than or equal to approximately 5% for radiation having a wavelength of between approximately 500 nm and approximately 700 nm). For example, for incident radiation 201a having an angle of incidence $\alpha_1$ greater than a critical angle, the angled sidewalls 205 may act to reflect the incident radiation 201a to within the recesses 206, where the incident radiation 201a can be subsequently absorbed into the substrate 202. The angled sidewalls 205 may further act to reduce an angle of incidence $\alpha_2$ for incident radiation 201b having a steep angle with respect to a top surface of the one or more absorption enhancement layers 222, thereby preventing the incident radiation 201b from reflecting from the substrate 202.

As shown in the top-view 224, the plurality of protrusions 204 are arranged within the pixel region 103 in rows and columns. In some embodiments, the pixel region 103 may have a size 226 that is in a range of between approximately 0.9 µm and approximately 2.2 µm. In various embodiments, the pixel region 103 may comprise different numbers of rows and columns of protrusions 204. In some embodiments, the pixel region 103 may comprise 4 rows and 4 columns of protrusions 204, so that the pixel region 103 comprises a 4×4 array of protrusions 204. It has been appreciated that the 4×4 array of protrusions 204 provides the image sensing element 104 within the pixel region 103 with a balanced QE between electromagnetic radiation within a visible region of the electromagnetic spectrum (e.g., electromagnetic radiation having wavelengths between approximately 400 nm and approximately 700 nm) and electromagnetic radiation within a near infrared (NIR) region of the electromagnetic spectrum (e.g., electromagnetic radiation having wavelengths between approximately 700 nm and approximately 2000 nm). For example, a 4×4 array of protrusions 204 can provide for a QE of approximately 71% for green light and approximately 34% for NIR radiation at approximately 850 nm.

Referring again to cross-sectional view 200, the plurality of protrusions 204 are bordered by a ridge 216 arranged on opposing sides of the pixel region 103. The ridge 216 comprises sidewalls having a plurality of different slopes and a substantially flat upper surface 218. The ridge 216 has a height that extends over the plurality of protrusions 204 by a non-zero distance 220. In some embodiments, the ridge 216 may have a height that is in a range of between approximately 5% and approximately 15% larger than the plurality of protrusions 204. For example, the ridge 216 may have a height that is in a range of between approximately 500 nm and approximately 600 nm.

As shown in the top-view 224, the ridge 216 continuously extends around an outer perimeter of the pixel region 103, so that the ridge 216 surrounds the pixel region 103 and completely separates the pixel region 103 from adjacent pixel regions.

Figure 3:
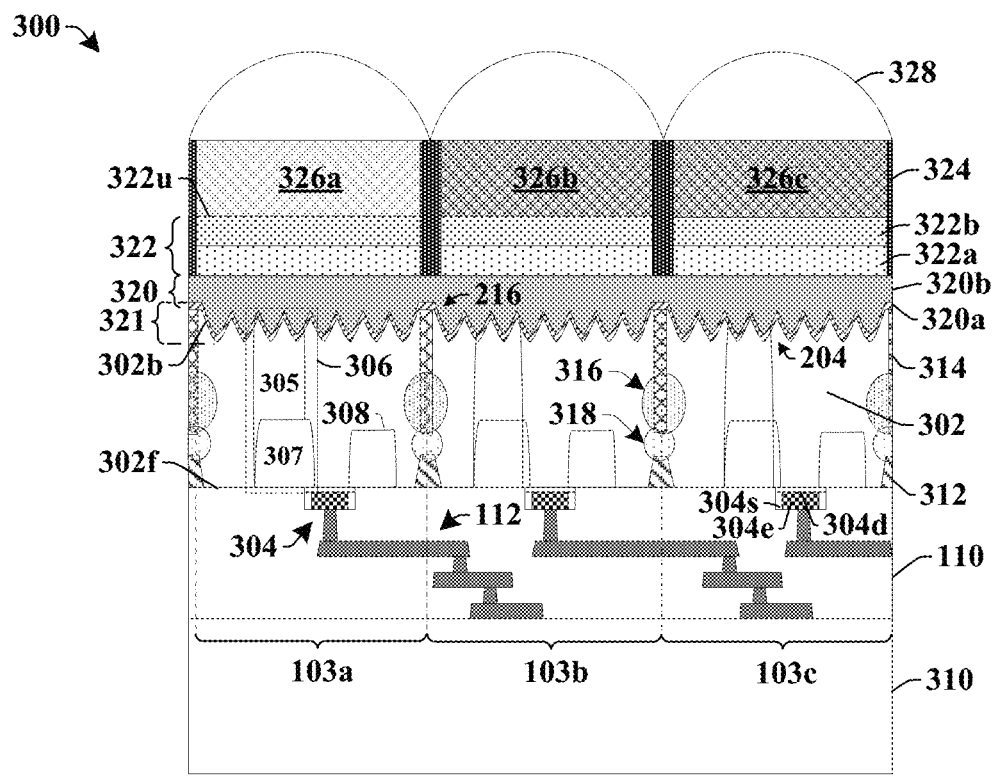
FIG. 3 illustrates a cross-sectional view of some embodiments of a back-side CMOS image sensor (BSI-CIS) comprising an absorption enhancement structure.

FIG. 3 illustrates a cross-sectional view of some embodiments of a back-side illuminated CMOS image sensor (BSI-CIS) integrated chip 300 comprising an absorption enhancement structure.

The BSI-CIS integrated chip 300 comprises a plurality of transistor gate structures 304 arranged along a front-side 302f of a substrate 302. In some embodiments, the plurality of transistor gate structures 304 may correspond to a transfer transistor, a source-follower transistor, a row select transistor, and/or a reset transistor. The plurality of transistor gate structures 304 have a gate dielectric layer 304d disposed along the front-side 302f of the substrate 302 and a gate electrode 304e arranged on the gate dielectric layer 304d. In some embodiments, sidewall spacers 304s are arranged on opposing sides of the gate electrode 304e.

In some embodiments, a transistor gate structure 304 corresponding to a transfer transistor is laterally arranged between a photodiode 306 and a floating diffusion well 308. In such embodiments, the photodiode 306 may comprise a first region 305 within the substrate 302 having a first doping type (e.g., n-type doping) and an adjoining second region 307 within the substrate 302 having a second doping type (e.g., p-type doping) that is different than the first doping type. The transistor gate structure 304 is configured to control the transfer of charge from the photodiode 306 to the floating diffusion well 308. If a charge level is sufficiently high within the floating diffusion well 308, a source-follower transistor (not shown) is activated and charges are selectively output according to operation of a row select transistor (not shown) used for addressing. A reset transistor (not shown) is configured to reset the photodiode 306 between exposure periods.

A dielectric structure 110 is arranged along the front-side 302f of the substrate 302. The dielectric structure 110 may comprise a plurality of stacked inter-level dielectric (ILD) layers. In various embodiments, the plurality of stacked inter-level dielectric (ILD) layers may comprise one or more of an oxide (e.g., $SiO_2$, SiCO, etc.), a fluorosilicate glass, a phosphate glass (e.g., borophosphate silicate glass), etc. The dielectric structure 110 surrounds a plurality of conductive interconnect layers 112 electrically coupled to the transistor gate structures 304. In some embodiments, the plurality of conductive interconnect layers 112 may comprise one or more of copper, aluminum, tungsten, and carbon nanotubes, for example. In some embodiments, the dielectric structure 110 is coupled to a carrier substrate 310 configured to provide structural support to the BSI-CIS integrated chip 300. In some embodiments, the carrier substrate 310 may comprise silicon.

Pixel regions 103a-103c are laterally separated from one another by a plurality of isolation structures. In some embodiments, the plurality of isolation structures may comprise a plurality of shallow trench isolation (STI) structures 312 comprising one or more dielectric materials (e.g., $SiO_2$) arranged within trenches in the front-side 302f of the substrate 302. In some embodiments, the plurality of isolation structures may comprise a plurality of back-side deep trench isolation (BDTI) structures 314 comprising one or more dielectric materials (e.g., $SiO_2$) arranged within trenches in a back-side 302b of the substrate 302. In some embodiments, the plurality of BDTI structures 314 may be arranged within a flat surface along the back-side 302b of the substrate 302 between adjacent ones of the pixel regions 103a-103c (e.g., along a ridge 216, shown in FIG. 2A, having a height greater than protrusions 204). In some embodiments, the plurality of BDTI structures 314 may respectively have a width that is smaller than a width of one of the plurality of STI structures 312. In some embodiments, the plurality of isolation structures may comprise a deep-well region 316 and/or a cell-well region 318 having one or more doping types that provide further isolation between adjacent pixel regions 103a-103c by way of junction isolation. The deep-well region 316 is arranged in the substrate 302 at a location laterally aligned with the STI structure 312 and/or the BDTI structure 314. The cell-well region 318 is arranged in the substrate 302 at a location vertically between the deep-well region 316 and the STI structure 312.

The back-side 302b of the substrate 302 has a non-planar surface comprising a plurality of protrusions 204. One or more absorption enhancement layers 320 are arranged along the non-planar back-side 302b of the substrate 302. The one or more absorption enhancement layers 320 are comprised within an absorption enhancement structure 321 configured to improve absorption of radiation by the photodiode 306. In some embodiments, the one or more absorption enhancement layers 320 may comprise an anti-reflective coating 320a and a dielectric layer 320b separated from the back-side 302b of the substrate 302 by the anti-reflective coating 320a. In some embodiments, the anti-reflective coating 320a may comprise a high-k dielectric material (e.g., hafnium oxide, nickel oxide, zirconium oxide etc.). In some embodiments, the dielectric layer 320b may comprise an oxide (e.g., $SiO_2$).

In some embodiments, the absorption enhancement structure 321 may comprise a nano-structure. For example, in some embodiments the absorption enhancement structure 321 may comprise a silicon nano-pillar array (Si-NPA). In such embodiments, the substrate 302 may comprise a porous silicon layer (not shown) arranged over a crystalline silicon bulk and comprising the plurality of protrusions 204. In contrast to crystalline silicon, which is an indirect band gap semiconductor, the Si-NPA is able to directly absorb photons (due to the quantum confinement effect of the carriers in silicon nano-crystallites of the Si-NPA), thereby increasing absorption of radiation by the substrate 302. In other embodiments, the absorption enhancement structure 321 may comprise a two-dimensional photonic crystal configured to selectively transmit photons within a certain photonic energy band, while blocking the transmission of photons outside of the photonic energy band. The two-dimensional photonic crystal can be used to transmit photons to the substrate 302 and to block reemitted photons, thereby effectively trapping reemitted photons inside the substrate 302. The trapped reemitted photons are subsequently reabsorbed by the substrate 302, which increases absorption by the substrate 302.

In some embodiments, a dielectric planarization structure 322 may be arranged over the one or more absorption enhancement layers 320. The dielectric planarization structure 322 has a substantially planar upper surface 322u. In various embodiments, the dielectric planarization structure 322 may comprise one or more stacked dielectric layers 322a-322b. For example, in some embodiments, the dielectric planarization structure 322 may comprise a first dielectric layer 322a comprising a first material and a second dielectric layer 322b stacked onto the first dielectric layer 322a and comprising a second material. In some embodiments, the first material and/or the second material may comprise an oxide (e.g., $SiO_2$) or a nitride, for example.

A grid structure 324 is disposed over the dielectric planarization structure 322. The grid structure 324 comprises sidewalls that define openings overlying the pixel regions 103a-103c. In various embodiments, the grid structure 324 may comprise a metal (e.g., aluminum, cobalt, copper, silver, gold, tungsten, etc.) and/or a dielectric material (e.g., $SiO_2$, SiN, etc.). A plurality of color filters, 326a-326c, are arranged within the openings in the grid structure 324. The plurality of color filters, 326a-326c, are respectively configured to transmit specific wavelengths of incident radiation. For example, a first color filter 326a may transmit radiation having wavelengths within a first range (e.g., corresponding to green light), while a second color filter 326b may transmit radiation having wavelengths within a second range (e.g., corresponding to red light) different than the first range, etc. A plurality of micro-lenses 328 are arranged over the plurality of color filters 326a-326c. Respective ones of the plurality of micro-lenses 328 are laterally aligned with the color filters, 326a-326c, and overlie the pixel regions 103a-103c. The plurality of micro-lenses 328 are configured to focus the incident radiation (e.g., light) towards the pixel regions 103a-103c.

FIGS. 4-9 illustrate cross-sectional views of some embodiments of a method of forming an absorption enhancement structure for an image sensor integrated chip. Although the cross-sectional-views shown in FIGS. 4-9 are described with reference to a method of forming an absorption enhancement structure for an image sensor integrated chip, it will be appreciated that the structures shown in the figures are not limited to the method of formation but rather may stand alone separate of the method.

Figure 4:
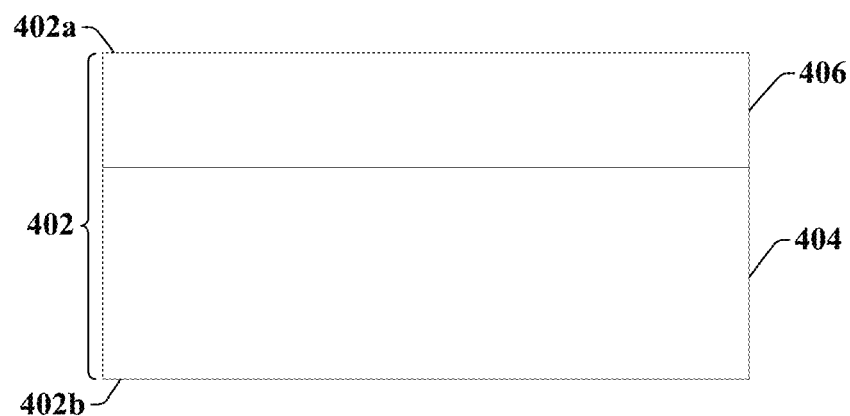
FIGS. 4-8 illustrate cross-sectional views of some embodiments of a method of forming an absorption enhancement structure for an image sensor integrated chip.

As illustrated in cross-sectional view 400 of FIG. 4, a substrate 402 is provided. The substrate 402 comprises a first side 402a and a second side 402b. The substrate 402 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 402 may comprise a base substrate 404 and an epitaxial layer 406. In some embodiments, the base substrate 404 and/or the epitaxial layer 406 may comprise silicon. Alternatively, the base substrate 404 and/or the epitaxial layer 406 may comprise silicon germanium, gallium arsenide, or another semiconductor material. In some embodiments, the substrate 402 may not have an epitaxial layer.

Figure 5:
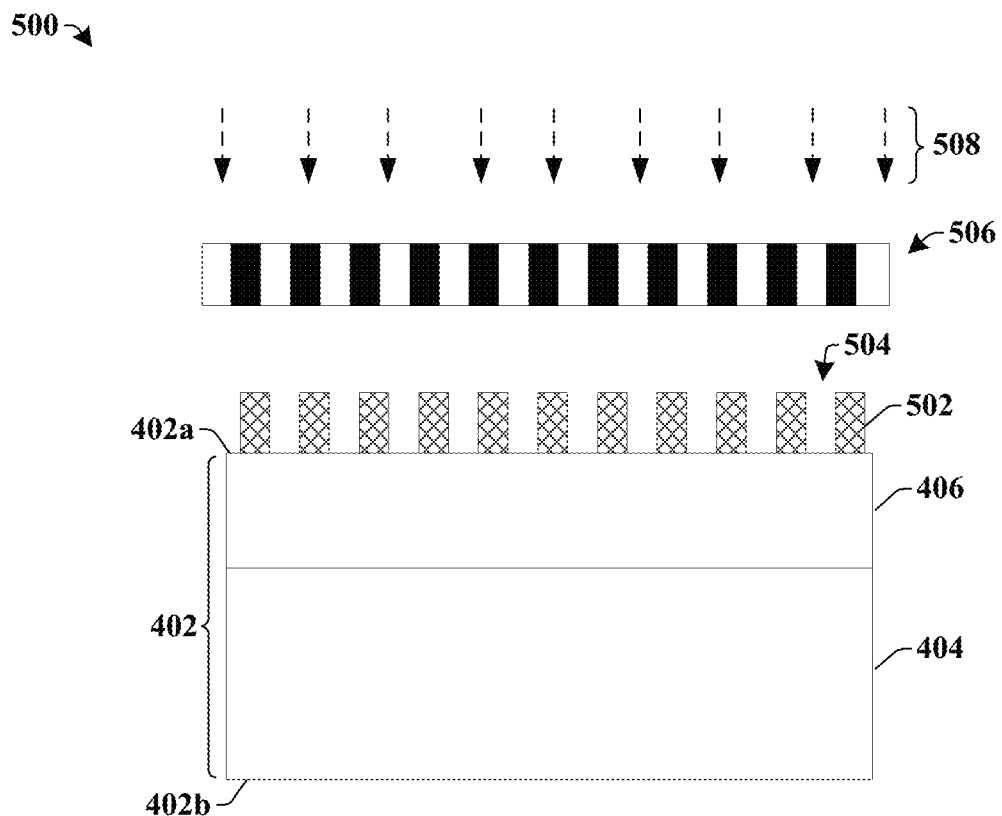

As shown in cross-sectional view 500 of FIG. 5, a patterned masking layer 502 is formed over the first side 402a of the substrate 402. The patterned masking layer 502 comprises sidewalls defining openings 504 arranged in a periodic pattern over the substrate 402. In some embodiments, the patterned masking layer 502 may be formed by depositing a layer of photosensitive material (e.g., a positive or negative photoresist) over the substrate 402. The layer of photosensitive material is selectively exposed to electromagnetic radiation 508 according to a photomask 506. The electromagnetic radiation 508 modifies a solubility of exposed regions within the photosensitive material to define soluble regions. The photosensitive material is subsequently developed to define the openings 504 within the photosensitive material by removing the soluble regions.

Figure 6A:
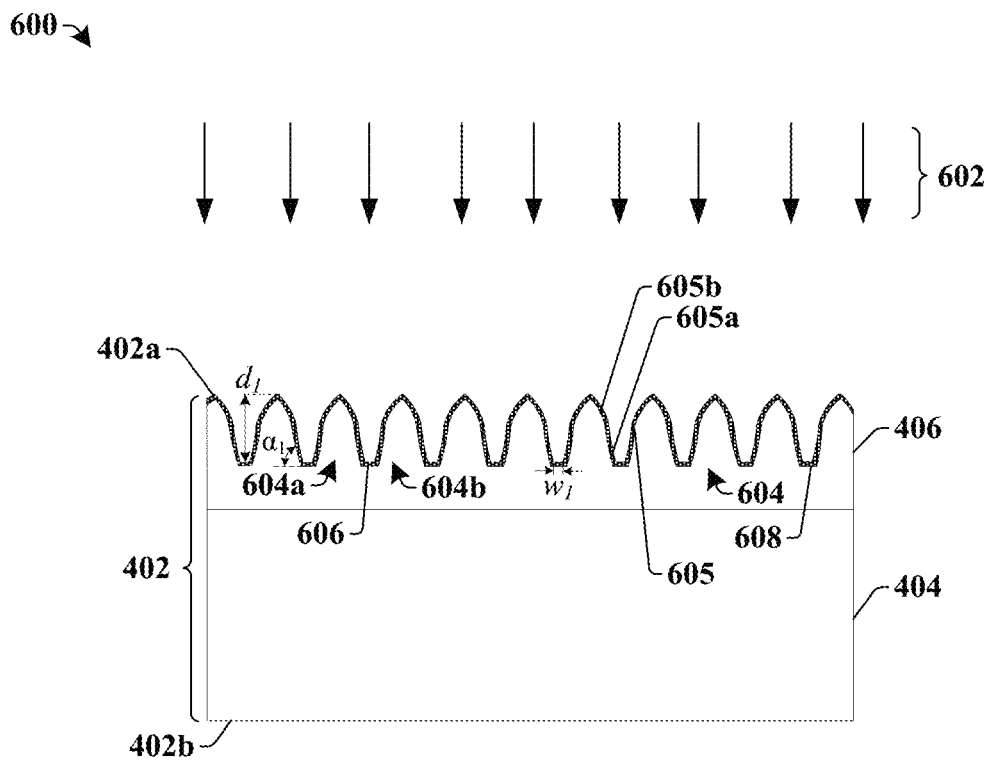

As shown in cross-sectional view 600 of FIG. 6A, a dry etching process is performed on the first side 402a of the substrate 402 according to the patterned masking layer (502 of FIG. 5). The dry etching process is performed by exposing unmasked regions of the substrate 402 to a dry etchant 602. The dry etchant 602 removes parts of the substrate 402 in the unmasked regions to define a plurality of recesses arranged between a plurality of intermediate protrusions 604 extending outward from the substrate 402. In some embodiments, the plurality of intermediate protrusions 604 comprise tapered protrusions having one or more angled sidewalls 605. The angled sidewalls 605 respectively comprise a first segment 605a having a first slope and a second segment 605b overlying the first segment 605a and having a second slope that is smaller than the first slope. In some embodiments, the plurality of intermediate protrusions 604 may comprise a first intermediate protrusion 604a separated from a second intermediate protrusion 604b by a bottom surface 606 comprising a substantially horizontal bottom surface. In some embodiments, the first segment 605a may have a sidewall that is coupled directly to the bottom surface 606 and that forms an acute angle ca of greater than 55° with respect to a plane extending along the bottom surface 606.

In some embodiments, the dry etching process may comprise a plasma etching process. For example, the plasma etching process may comprise a coupled plasma etching process, such as an inductively coupled plasma (ICP) etching process or a capacitively coupled plasma (CCP) etching process. In other embodiments, the dry etching process may comprise a sputter etching process, an ion milling process, or a reactive ion etching (RIE) process. In some embodiments, the dry etchant 602 may have an etching chemistry comprising a fluorine species (e.g., $CF_4$, $CHF_3$, $C_4F_8$, etc.). The dry etching process may result in a damaged region 608 arranged along outer surfaces of the plurality of intermediate protrusions 604. The damaged region 608 includes defects (e.g., interstitial and/or vacancies) within the crystalline lattice of the substrate 402, which can negatively impact performance of a resulting image sensor integrated chip.

In some embodiments, wherein the absorption enhancement structure comprises a silicon nano-pillar array (Si-NPA), a layer of porous silicon (not shown) may be formed along the first side 402a of the substrate 402 prior to the dry etch process. In some embodiments, the layer of porous silicon may be formed by exposing the first side 402a of the substrate 402 to hydroflouric acid. In some additional embodiments, the layer of porous silicon may be formed by exposing the first side 402a of the substrate 402 to a stain etching process comprising hydroflouric acid, nitric acid, and water.

In some embodiments, the dry etchant 602 may remove the masking layer (502 of FIG. 5) from over the substrate 402. In other embodiments (not shown), the patterned masking layer (502 of FIG. 5) may be removed by a plasma stripping/ashing process performed after the dry etching process and prior to exposing the substrate 402 to a wet etchant (shown in FIG. 6B). In yet other embodiments (not shown), the patterned masking layer (502 of FIG. 5) may be kept in place while exposing the substrate 402 to a wet etchant (shown in FIG. 6B) and subsequently removed during or after the wet etching process.

Figure 6B:
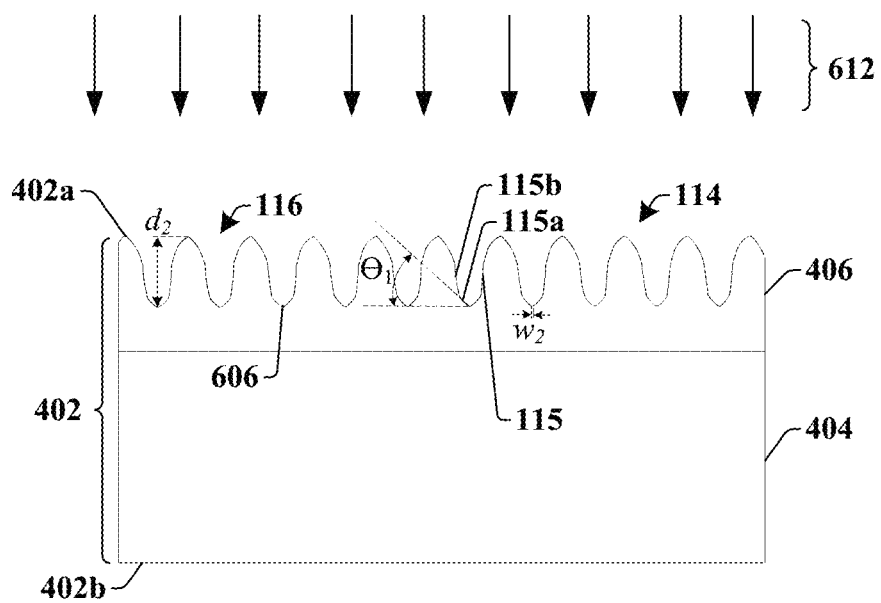

As shown in cross-sectional view 610 of FIG. 6B, a wet etching process is performed on the first side 402a of the substrate 402 after the dry etching process is finished. The wet etching process is performed by exposing the first side 402a of the substrate 402 to a wet etchant 612. The wet etchant 612 removes the damaged region (608 of FIG. 6A) of the plurality of intermediate protrusions (604 of FIG. 6A). The wet etching process also changes a profile of the plurality of intermediate protrusions 604 to form a plurality of protrusions 114 respectively having sidewalls 115 comprising a first segment 115a having a first slope a second segment 115b overlying the first segment 115a and having a second slope that is larger than the first slope. In some embodiments, the first segment 115a may have a sidewall angle $\Theta_1$ in a range of between approximately 45° and approximately 55°.

In some embodiments, the wet etchant 612 may comprise tetramethylammonium hydroxide (TMAH). In other embodiments, the wet etchant 612 may comprise potassium hydroxide (KOH) or a similar etchant. The wet etchant 612 may increase a depth of recesses 116 arranged between the protrusions 114 from the first depth $d_1$ (shown in FIG. 6A) to a larger second depth $d_2$ ($d_2 > d_1$).

The wet etchant 612 may also reduce a width of the bottom surface 606 from a first width $w_1$ (shown in FIG. 6A) to a second width $w_2$ smaller than the first width $w_1$. In some embodiments, the wet etchant 612 changes the bottom surface from a substantially horizontal surface to a curved surface. Reducing a width of the bottom surface 606 reduces a reflection of radiation from the substrate 402 in comparison to the structure shown in FIG. 6A (formed by a dry etching process, but not a wet etching process) by between approximately 3% and approximately 5%. This corresponds to a reduction in reflection of between approximately 58% and approximately 60% relative to a substrate having a flat first surface.

Figure 7:
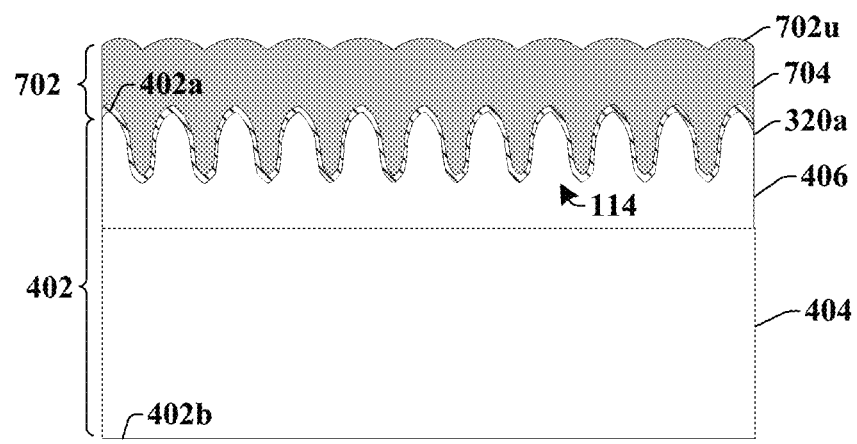

As shown in cross-sectional view 700 of FIG. 7, one or more absorption enhancement layers 702 are formed over and between the plurality of protrusions 114. In various embodiments, the one or more absorption enhancement layers 702 may comprise a dielectric material (e.g., silicon oxide, TEOS, etc.). In some embodiments, the one or more absorption enhancement layers 702 may comprise an anti-reflective coating 320a and a dielectric layer 704 separated from the plurality of protrusions 114 by the anti-reflective coating 320a. In some embodiments, the anti-reflective coating 320a may comprise a high-k material and the dielectric layer 704 may comprise an oxide. The one or more absorption enhancement layers 702 may comprise an upper surface 702u having a plurality of curved surfaces arranged over the protrusions 114 and intersecting one another.

Figure 8:
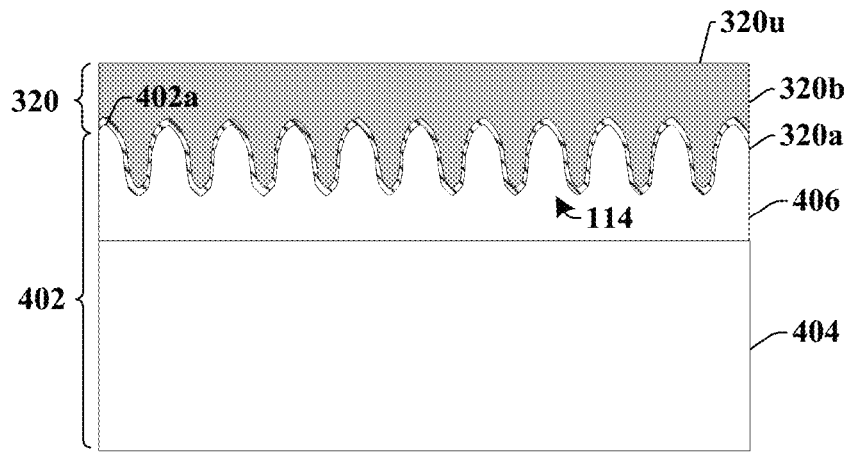

As shown in cross-sectional view 800 of FIG. 8, a planarization process (e.g., a chemical mechanical planarization process) may be performed after depositing the one or more absorption enhancement layers 320. The planarization process forms a substantially planar surface 320u along an upper surface of the one or more absorption enhancement layers 320. The substantially planar surface 320u faces away from the substrate 402.

Figure 9:
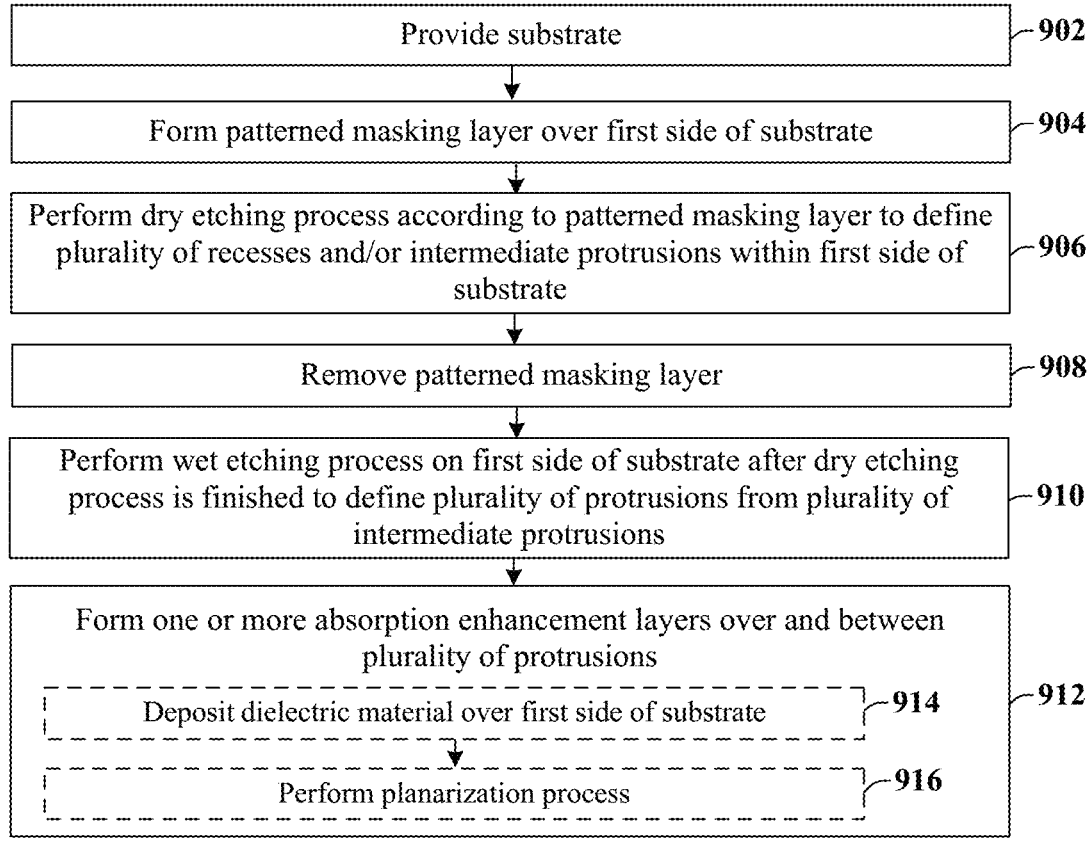
FIG. 9 illustrates a flow diagram of some embodiments of a method of forming an absorption enhancement structure for an image sensor integrated chip.

FIG. 9 illustrates a flow diagram of some embodiments of a method 900 of forming an absorption enhancement structure for an image sensor integrated chip.

While disclosed methods (e.g., methods 900, 1900, and 2700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a substrate is provided. FIG. 4 illustrates a cross-sectional view 400 of some embodiments corresponding to act 902.

At 904, a patterned masking layer is formed over a first side of the substrate. FIG. 5 illustrates a cross-sectional view 500 of some embodiments corresponding to act 904.

At 906, a dry etching process is performed according to the patterned masking layer to define a plurality of recesses and/or intermediate protrusions within the first side of the substrate. FIG. 6A illustrates a cross-sectional view 600 of some embodiments corresponding to act 906.

At 908, the patterned masking layer may be removed, in some embodiments. FIG. 6B illustrates a cross-sectional view 610 of some embodiments corresponding to act 908.

At 910, a wet etching process is performed on the first side of the substrate after the dry etching process is finished to define a plurality of protrusions from the plurality of intermediate protrusions. FIG. 6B illustrates a cross-sectional view 610 of some embodiments corresponding to act 910.

At 912, one or more absorption enhancement layers are formed over and between the plurality of protrusions. In some embodiments, the one or more absorption enhancement layers may be formed by depositing a dielectric material over the first side of the substrate, at 914. A planarization process is subsequently performed to give the one or more absorption enhancement layers a planar surface facing away from the substrate, at 916. FIGS. 7-8 illustrate cross-sectional views, 700 and 800, of some embodiments corresponding to act 912.

FIGS. 10-18 illustrate cross-sectional views of some embodiments of a method of forming a BSI-CIS comprising an absorption enhancement structure.

Figure 10:
FIGS. 10-18 illustrate cross-sectional views of some embodiments of a method of forming a BSI-CIS comprising an absorption enhancement structure.

As illustrated in cross-sectional view 1000 of FIG. 10, a substrate 402 is provided. In some embodiments, the substrate 402 may comprise a base substrate 404 and an epitaxial layer 406. The epitaxial layer 406 comprises a front-side 406f contacting the base substrate 404 and a back-side 406b. In some such embodiments, the epitaxial layer 406 and/or the base substrate 404 may comprise a semiconductor material, such as silicon. In other embodiments, the substrate 402 may not comprise an epitaxial layer.

Figure 11:
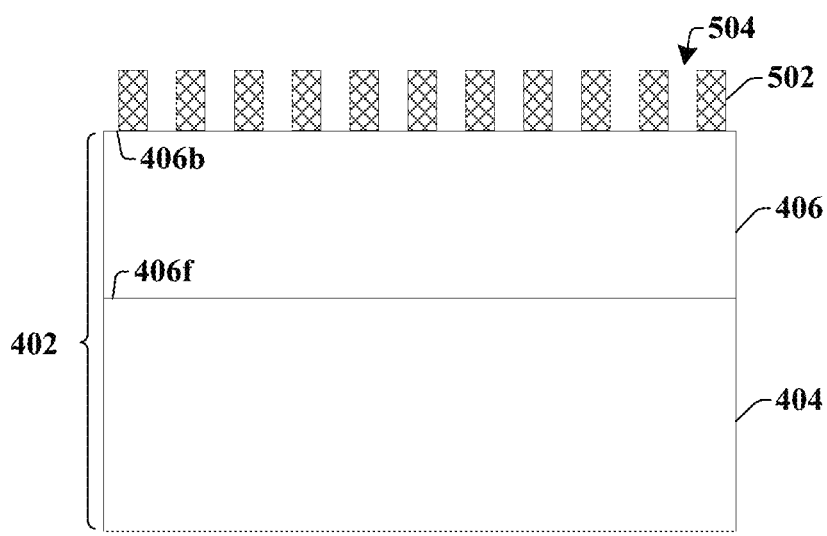

As shown in cross-sectional view 1100 of FIG. 11, a patterned masking layer 502 is formed along the back-side 406b of the epitaxial layer 406. The patterned masking layer 502 comprises sidewalls defining openings 504 arranged in a periodic pattern over the epitaxial layer 406.

Figure 12A:
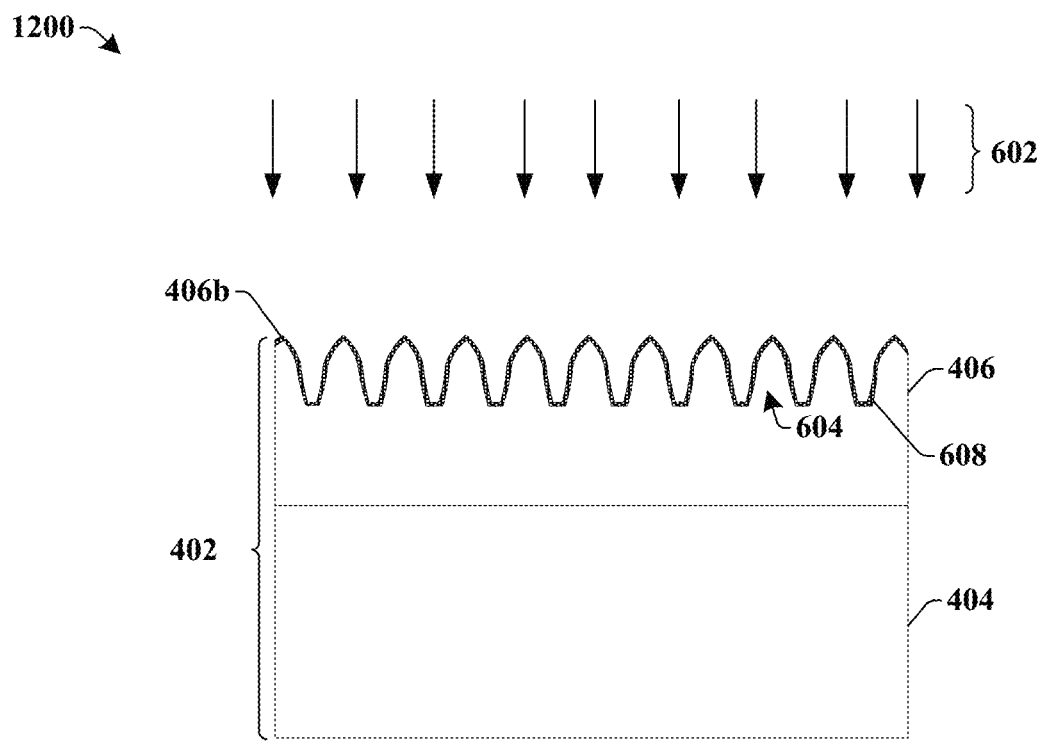

As shown in cross-sectional view 1200 of FIG. 12A, a dry etching process is performed on the back-side 406b of the epitaxial layer 406 according to the patterned masking layer (502 of FIG. 11). The dry etching process exposes unmasked regions of the back-side 406b of the epitaxial layer 406 to a dry etchant 602, which removes parts of the epitaxial layer 406 to define a plurality of intermediate protrusions 604 arranged in a periodic pattern along the back-side of the epitaxial layer 406. The plurality of intermediate protrusions 604 are laterally separated from one another by recesses within the back-side 406b of the epitaxial layer 406. In some embodiments, the plurality of intermediate protrusions 604 may have a profile as described above in relation to FIG. 6A. The dry etching process may result in a damaged region 608 arranged along outer edges of the plurality of intermediate protrusions 604. The damaged region 608 includes defects (e.g., interstitial and/or vacancies) within the crystalline lattice of the epitaxial layer 406.

Figure 12B:
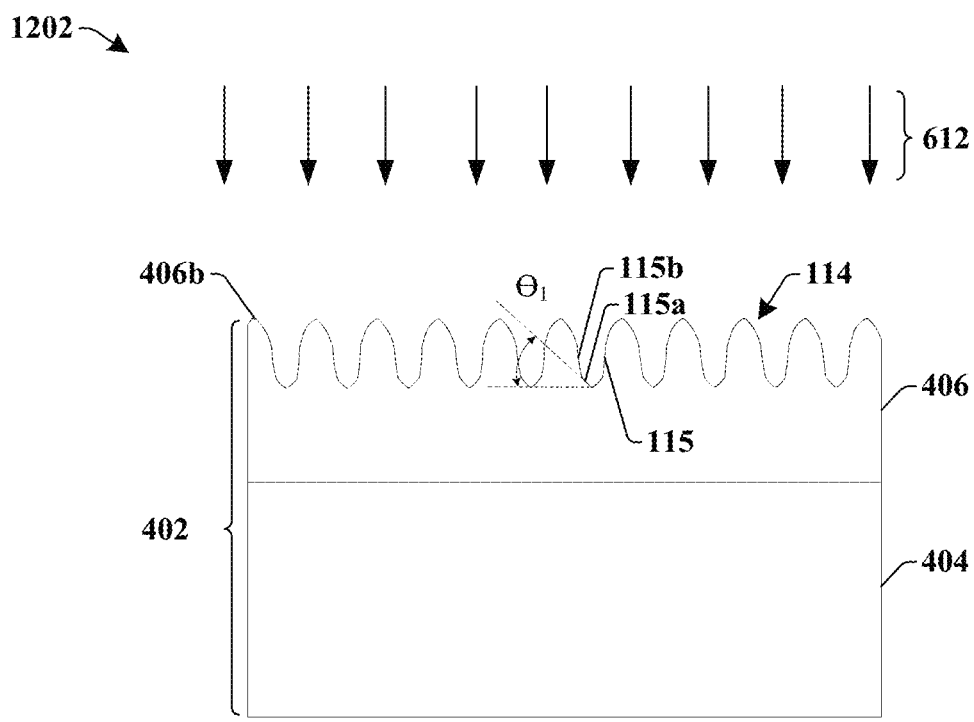

As shown in cross-sectional view 1202 of FIG. 12B, a wet etching process is performed on the back-side 406b of the epitaxial layer 406 after the dry etching process is finished. The wet etching process exposes the back-side 406b of the epitaxial layer 406 to a wet etchant 612 (e.g., TMAH, KOH, etc.). The wet etchant 612 etches the back-side 406b of the epitaxial layer 406 and removes the damaged region (608 of FIG. 12A) to form a plurality of protrusions 114 from the plurality of intermediate protrusions (604 of FIG. 12A). The wet etching process causes the plurality of protrusions 114 to respectively have sidewalls 115 comprising a first segment 115a with a first slope and a second segment 115b overlying the first segment 115a and having a second slope that is larger than the first slope.

Figure 13:
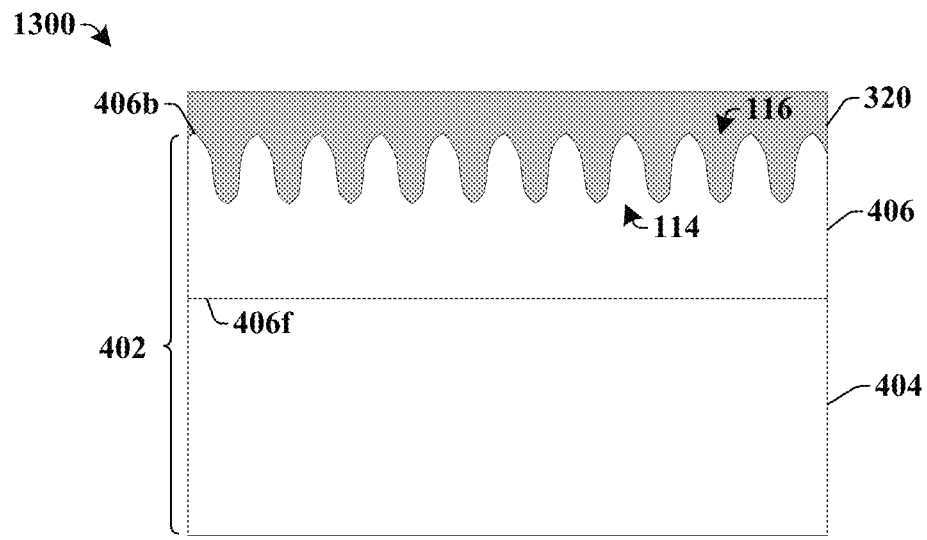

As shown in cross-sectional view 1300 of FIG. 13, one or more absorption enhancement layers 320 are formed over and between the plurality of protrusions 114. The one or more absorption enhancement layers 320 may be formed by depositing a dielectric material (e.g., silicon oxide, TEOS, etc.) onto the back-side 406b of the epitaxial layer 406. A planarization process (e.g., a CMP process) may subsequently be performed on the one or more absorption enhancement layers 320.

Figure 14:
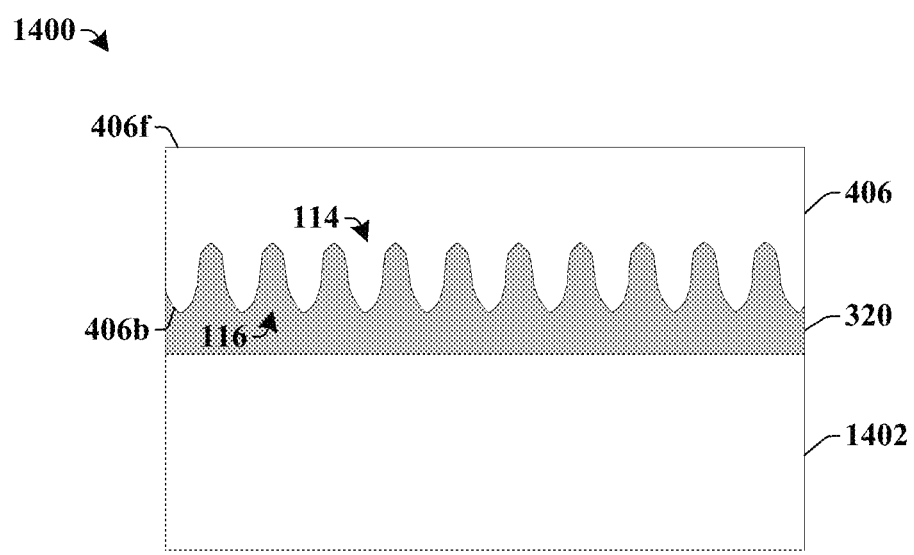

As shown in cross-sectional view 1400 of FIG. 14, the one or more absorption enhancement layers 320 are bonded to a support substrate 1402. In some embodiments, the support substrate 1402 may comprise a silicon substrate. In some embodiments, the base substrate 404 may be removed after bonding to thin the substrate and allow for radiation to pass through the epitaxial layer 406 to image sensing elements (104 of FIG. 15). In various embodiments, the substrate 402 may be removed by etching and/or mechanical grinding a front-side of the substrate 402. In other embodiments, wherein the substrate 402 does not comprise an epitaxial layer, the substrate 402 may be thinned after bonding to reduce a thickness of the substrate 402. In various embodiments, the substrate 402 may be thinned and/or removed by etching and/or mechanical grinding a front-side of the substrate 402.

Figure 15:
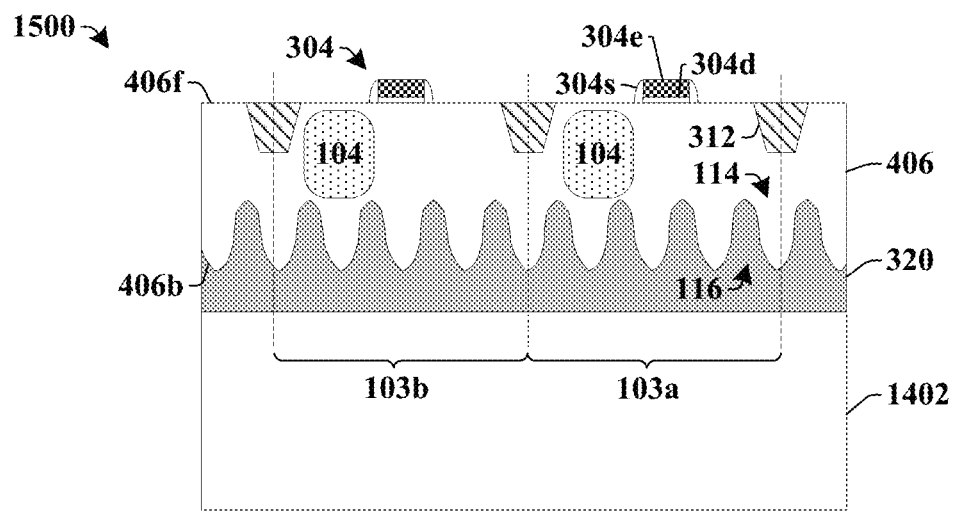

As shown in cross-sectional view 1500 of FIG. 15, image sensing elements 104 are formed within pixel regions 103a-103b of the epitaxial layer 406. In some embodiments, the image sensing elements 104 may comprise photodiodes formed by implanting one or more dopant species into the front-side 406f of the epitaxial layer 406. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

One or more transistor gate structures 304 are formed along the front-side 406f of the epitaxial layer 406 within the pixel regions 103a-103b. In various embodiments, the one or more transistor gate structures 304 may correspond to a transfer transistor, a source-follower transistor, a row select transistor, and a reset transistor. In some embodiments, the one or more transistor gate structures 304 may be formed by depositing a gate dielectric film and a gate electrode film on the front-side 406f of the epitaxial layer 406. The gate dielectric film and the gate electrode film are subsequently patterned to form a gate dielectric layer 304d and a gate electrode 304e. Sidewall spacers 304s may be formed on the outer sidewalls of the gate electrode 304e. In some embodiments, the sidewall spacers 304s may be formed by depositing a spacer layer (e.g., a nitride, an oxide, etc.) onto the front-side 406f of the epitaxial layer 406 and selectively etching the nitride to form the sidewall spacers 304s.

In some embodiments, one or more shallow trench isolation (STI) structures 312 may be formed within the front-side 406f of the epitaxial layer 406 on opposing sides of the pixel regions 103a-103b. The STI structures 312 may be formed by selectively etching the front-side 406f of the epitaxial layer 406 to form trenches and subsequently forming one or more dielectric materials within the trenches. In some embodiments, the STI structures 312 may be formed prior to formation of the one or more transistor gate structures 304, the image sensing elements 104 and/or the floating diffusion well.

Figure 16:
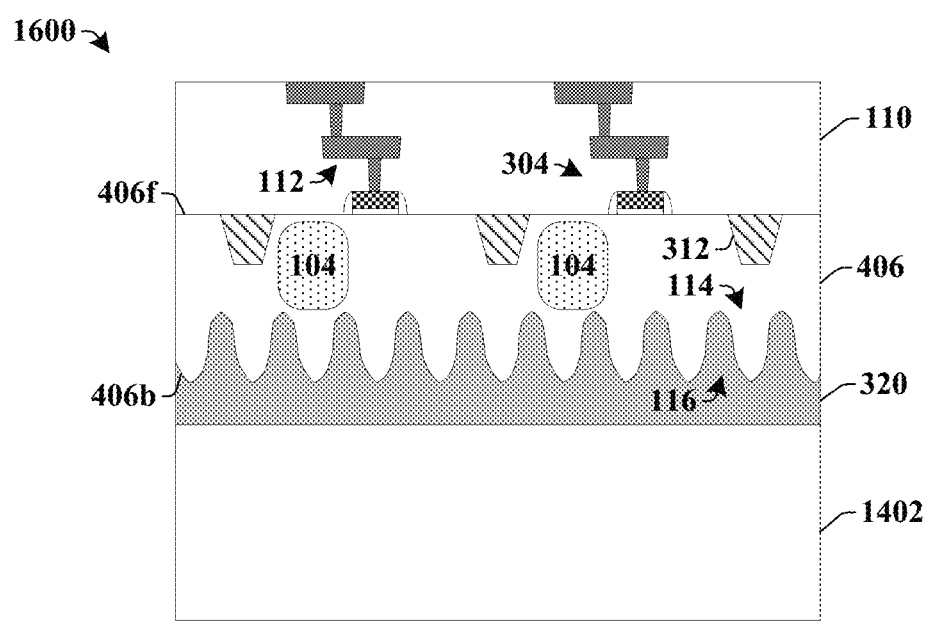

As shown in cross-sectional view 1600 of FIG. 16, a plurality of conductive interconnect layers 112 are formed within a dielectric structure 110 formed along the front-side 406*f* of the epitaxial layer 406. In some embodiments, the plurality of conductive interconnect layers 112 may be formed using a damascene process (e.g., a single damascene process or a dual damascene process). The damascene process is performed by forming an ILD layer over the front-side 406*f* of the epitaxial layer 406, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the plurality of conductive interconnect layers 112 may comprise tungsten, copper, or aluminum copper, for example.

Figure 17:
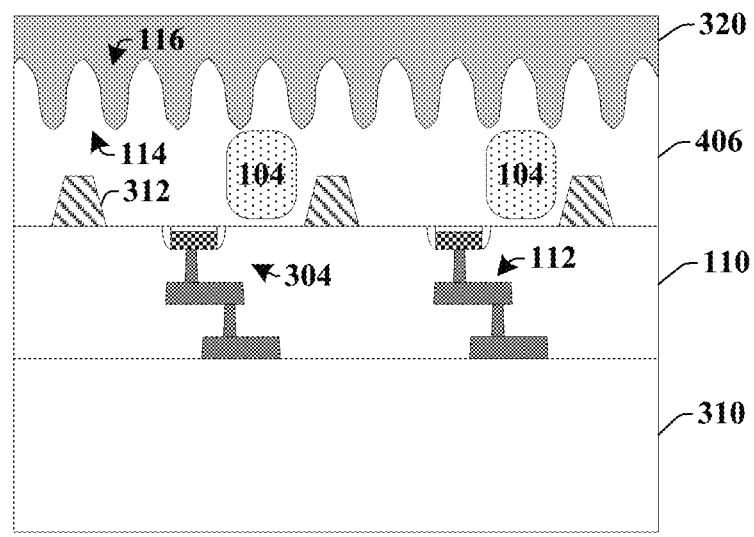

As shown in cross-sectional view 1700 of FIG. 17, the dielectric structure 110 is bonded to a carrier substrate 310 and the support substrate (1402 of FIG. 16) is subsequently removed. In some embodiments, the bonding process may use an intermediate bonding oxide layer (not shown) arranged between the dielectric structure and the carrier substrate 310. In some embodiments, the bonding process may comprise a fusion bonding process. In some embodiments, the carrier substrate 310 may comprise a silicon substrate.

Figure 18:
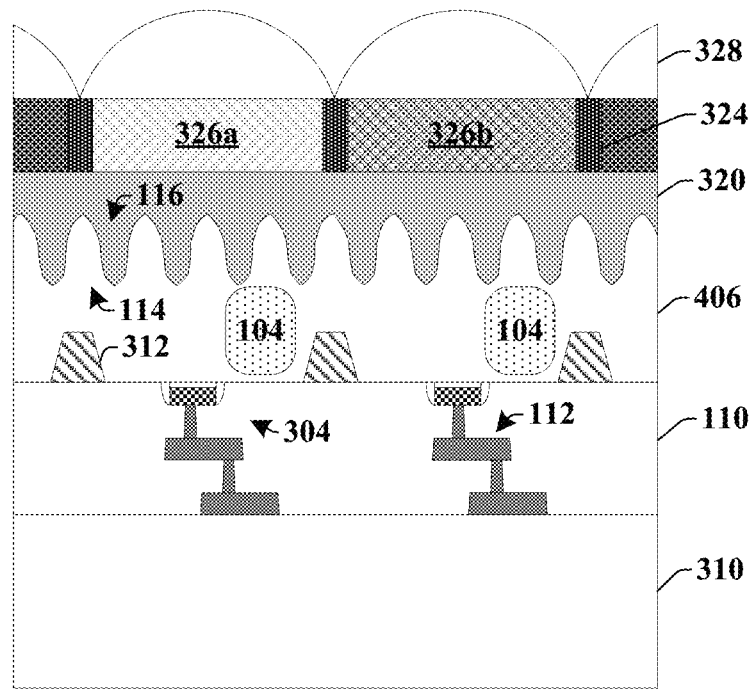

As shown in cross-sectional view 1800 of FIG. 18, a plurality of color filters 326*a*-326*b* are formed over the one or more absorption enhancement layers 320. In some embodiments, the plurality of color filters 326*a*-326*b* may be formed within openings in a grid structure 324 overlying the one or more absorption enhancement layers 320. In some embodiments, the plurality of color filters 326*a*-326*b* may be formed by forming a color filter layer and patterning the color filter layer. The color filter layer is formed of a material that allows for the transmission of radiation (e.g., light) having a specific range of wavelength, while blocking light of wavelengths outside of the specified range.

A plurality of micro-lenses 328 are formed over the plurality of color filters 326*a*-326*b*. In some embodiments, the plurality of micro-lenses 328 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 328 are then formed by selectively etching the micro-lens material according to the micro-lens template.

Figure 19:
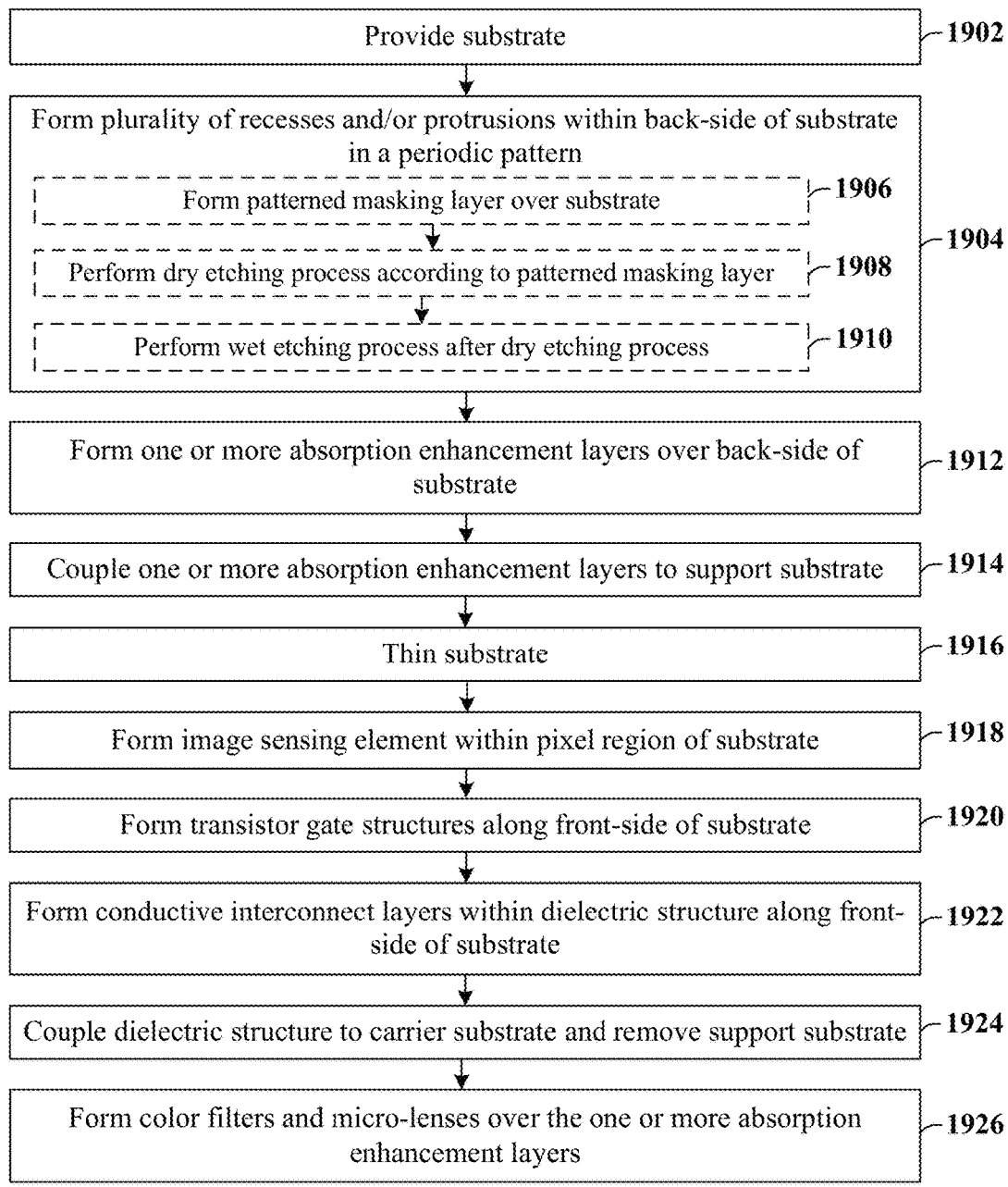
FIG. 19 illustrates a flow diagram of some embodiments of a method of forming a BSI-CIS comprising an absorption enhancement structure.

FIG. 19 illustrates a flow diagram of some embodiments of a method 1900 of forming a BSI-CIS comprising an absorption enhancement structure.

At 1902, a substrate is provided. FIG. 10 illustrates a cross-sectional view 1000 of some embodiments corresponding to act 1902.

At 1904, a plurality of recesses and/or protrusions are formed within a back-side of the substrate. In some embodiments, the plurality of recesses and/or protrusions may be formed by forming a patterned masking layer over the back-side of the substrate at 1906. A dry etching process may be performed with the patterned masking layer in place to form a plurality of intermediate protrusions, at 1908. A wet etching process is subsequently performed after the dry etching process is completed to form a plurality of protrusions from the plurality of intermediate protrusions, at 1910. FIGS. 11-12B illustrates cross-sectional views of some embodiments corresponding to act 1904.

At 1912, one or more absorption enhancement layers are formed over the back-side of the substrate. FIG. 13 illustrates a cross-sectional view 1300 of some embodiments corresponding to act 1912.

At 1914, the one or more absorption enhancement layers are coupled to a support substrate. FIG. 14 illustrates a cross-sectional view 1400 of some embodiments corresponding to act 1914.

At 1916, the substrate is thinned to reduce a thickness of the substrate. FIG. 14 illustrates a cross-sectional view 1400 of some embodiments corresponding to act 1916.

At 1918, an image sensing element is formed within a pixel region of a substrate. FIG. 15 illustrates a cross-sectional view 1500 of some embodiments corresponding to act 1918.

At 1920, one or more transistor gate structures for transistor devices are formed along a front-side of the substrate. FIG. 15 illustrates a cross-sectional view 1500 of some embodiments corresponding to act 1920.

At 1922, a plurality of conductive interconnect layer are formed within a dielectric structure along the front-side of the substrate. FIG. 16 illustrates a cross-sectional view 1600 of some embodiments corresponding to act 1922.

At 1924, the dielectric structure is coupled to a carrier substrate and the support substrate is removed. FIG. 17 illustrates a cross-sectional view 1700 of some embodiments corresponding to act 1924.

At 1926, color filters and micro-lenses are formed over the one or more absorption enhancement layers. FIG. 18 illustrates a cross-sectional view 1800 of some embodiments corresponding to act 1926.

FIGS. 20-26 illustrate cross-sectional views of some embodiments of an alternative method of forming a BSI-CIS comprising an absorption enhancement structure.

Figure 20:
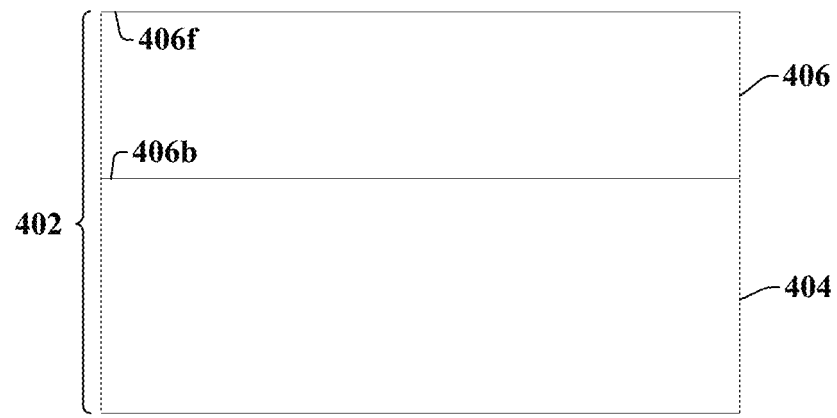
FIGS. 20-26 illustrate cross-sectional views of some embodiments of an alternative method of forming a BSI-CIS comprising an absorption enhancement structure.

As illustrated in cross-sectional view 2000 of FIG. 20, a substrate 402 is provided. In some embodiments, the substrate 402 may comprise a base substrate 404 and an epitaxial layer 406 comprising a front-side 406*f* and a back-side 406*b*. In some such embodiments, the epitaxial layer 406 and/or the base substrate 404 may comprise silicon. In other embodiments, the substrate 402 may not comprise an epitaxial layer.

Figure 21:
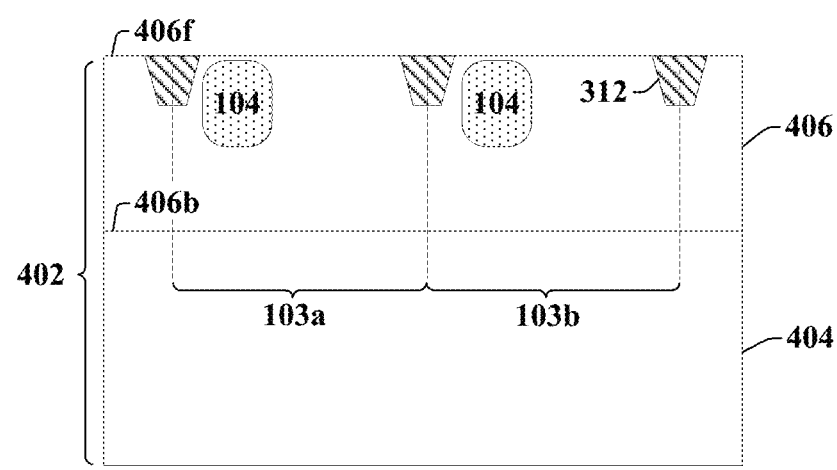

As shown in cross-sectional view 2100 of FIG. 21, image sensing elements 104 are formed within pixel regions 103*a*-103*b* of the epitaxial layer 406. In some embodiments, the image sensing elements 104 may comprise photodiodes formed by implanting one or more dopant species into the front-side 406*f* of the epitaxial layer 406. In some embodiments, one or more shallow trench isolation (STI) structures 312 may be formed within the front-side 406*f* of the epitaxial layer 406 on opposing sides of the pixel regions 103*a*-103*b*.

Figure 22:
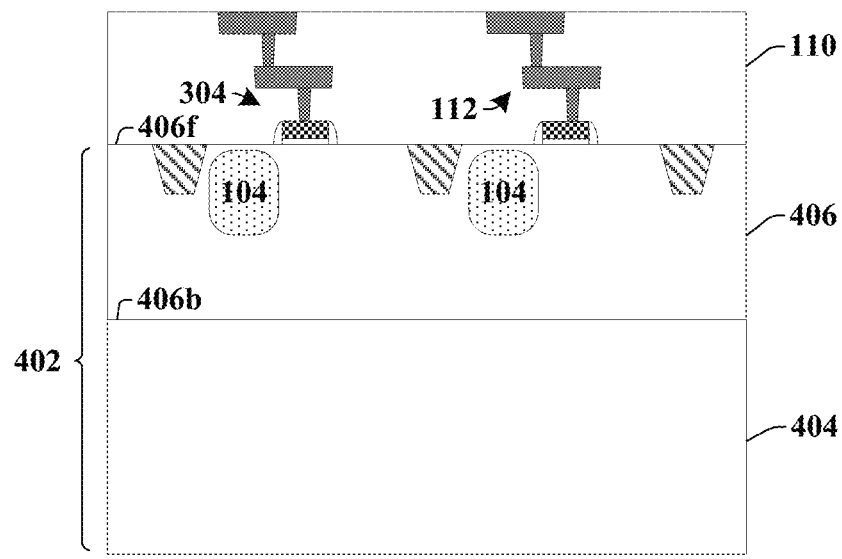

As shown in cross-sectional view 2200 of FIG. 22, one or more transistor gate structures 304 are formed along the front-side 406*f* of the epitaxial layer 406 within the pixel regions 103*a*-103*b*. A plurality of conductive interconnect layers 112 (e.g., copper, aluminum, and/or tungsten metal interconnect layers) are formed within a dielectric structure 110 formed along the front-side 406f of the epitaxial layer 406. In some embodiments, the plurality of conductive interconnect layers 112 may be formed using a damascene process (e.g., a dual damascene process).

Figure 23:
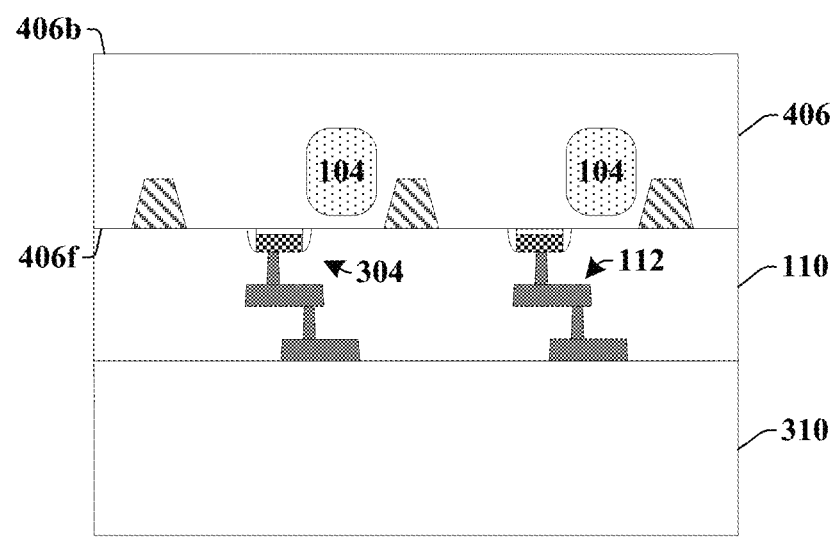

As shown in cross-sectional view 2300 of FIG. 23, the dielectric structure 110 is bonded to a carrier substrate 310.

Figure 24:
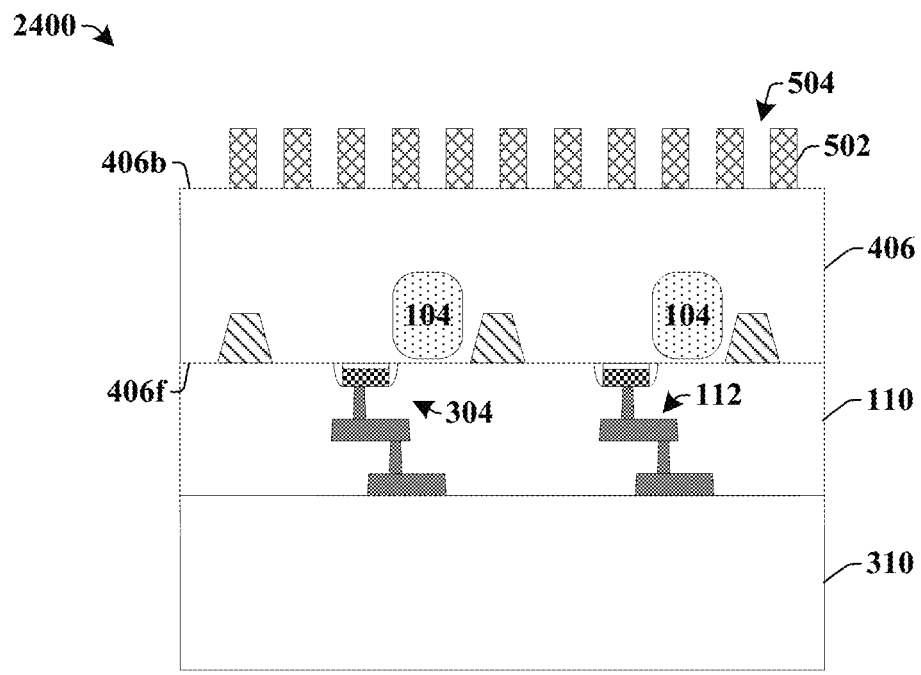

As shown in cross-sectional view 2400 of FIG. 24, a patterned masking layer 502 is formed along the back-side 406b of the epitaxial layer 406. The patterned masking layer 502 comprises sidewalls defining openings 504 arranged in a periodic pattern over the epitaxial layer 406.

Figure 25A:
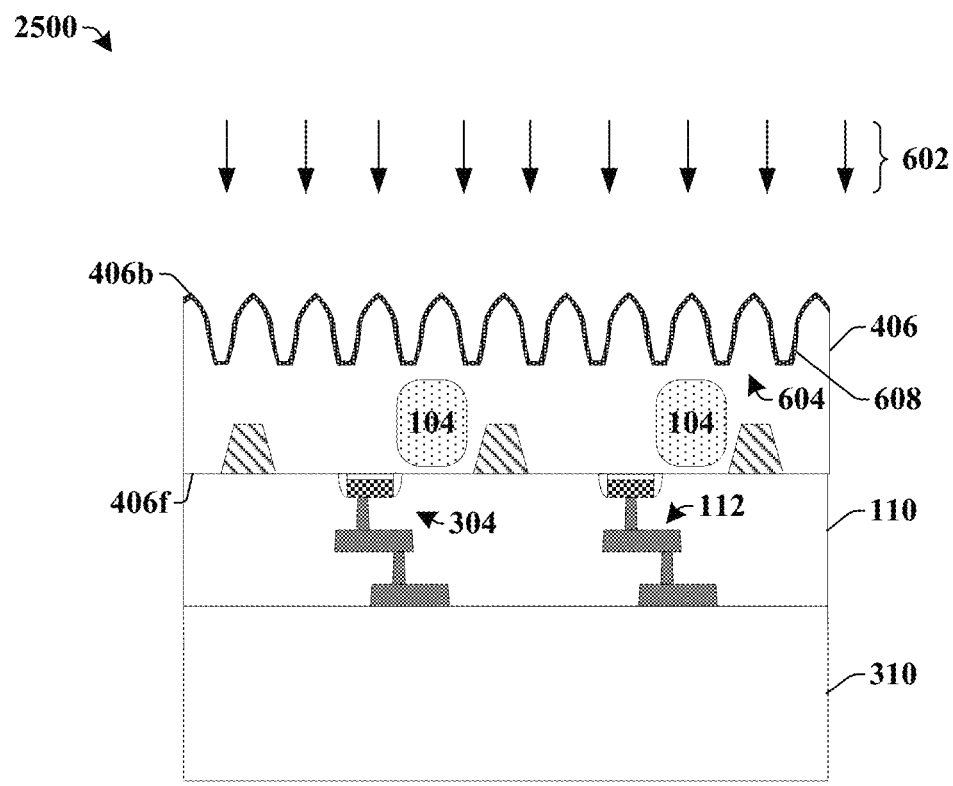

As shown in cross-sectional view 2500 of FIG. 25A, a dry etching process is performed on a back-side 406b of the epitaxial layer 406 according to the patterned masking layer (502 of FIG. 24). The dry etching process exposes unmasked regions of the back-side 406b of the epitaxial layer 406 to a dry etchant 602, which removes parts of the epitaxial layer 406 to define a plurality of intermediate protrusions 604 arranged in a periodic pattern along the back-side of the epitaxial layer 406. In some embodiments, the plurality of intermediate protrusions 604 may have a profile as described above in relation to FIG. 6A. The dry etching process may result in a damaged region 608 arranged along outer edges of the plurality of intermediate protrusions 604 and having defects within the crystalline lattice of the epitaxial layer 406.

Figure 25B:
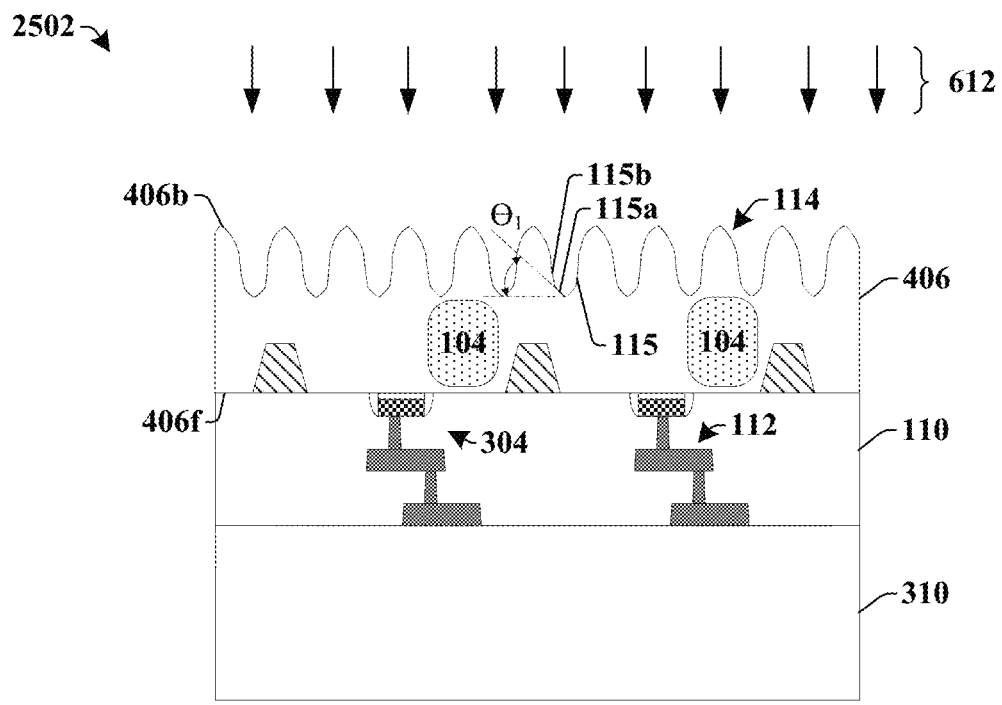

As shown in cross-sectional view 2502 of FIG. 25B, a wet etching process is performed on the back-side 406b of the epitaxial layer 406 after the dry etching process is finished. The wet etching process exposes the back-side 406b of the epitaxial layer 406 to a wet etchant 612 (e.g., TMAH, KOH, etc.) to remove the damaged region (608 of FIG. 25A) to form a plurality of protrusions 114 from the plurality of intermediate protrusions (604 of FIG. 25A). The wet etching process causes the plurality of protrusions 114 to respectively have sidewalls 115 comprising a first segment 115a having a first sidewall angle and a second segment 115b overlying the first segment 115a and having a second sidewall angle that is larger than the first sidewall angle.

Figure 26:
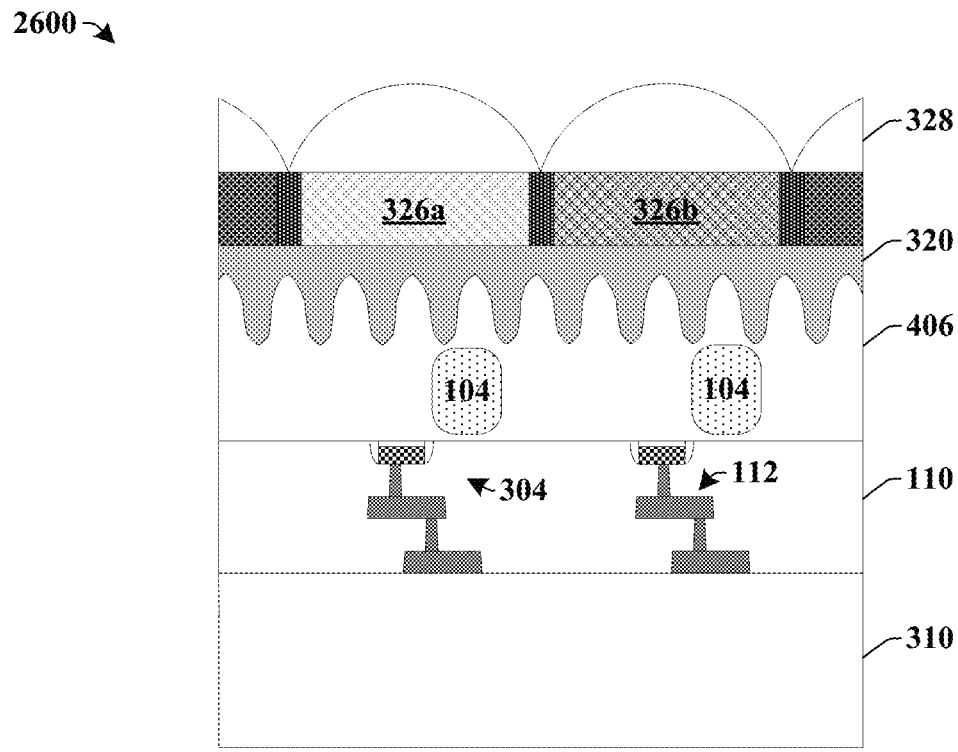

As shown in cross-sectional view 2600 of FIG. 26, one or more absorption enhancement layers 320 are formed over and between the plurality of protrusions 114. The one or more absorption enhancement layers 320 may be formed by depositing a dielectric material (e.g., silicon oxide, TEOS, etc.) onto the back-side 406b of the epitaxial layer 406. A plurality of color filters 326a-326b are formed over the one or more absorption enhancement layers 320, and a plurality of micro-lenses 328 are formed over the plurality of color filters 326a-326b. A planarization process (e.g., a CMP process) may subsequently be performed on the one or more absorption enhancement layers 320.

Figure 27:
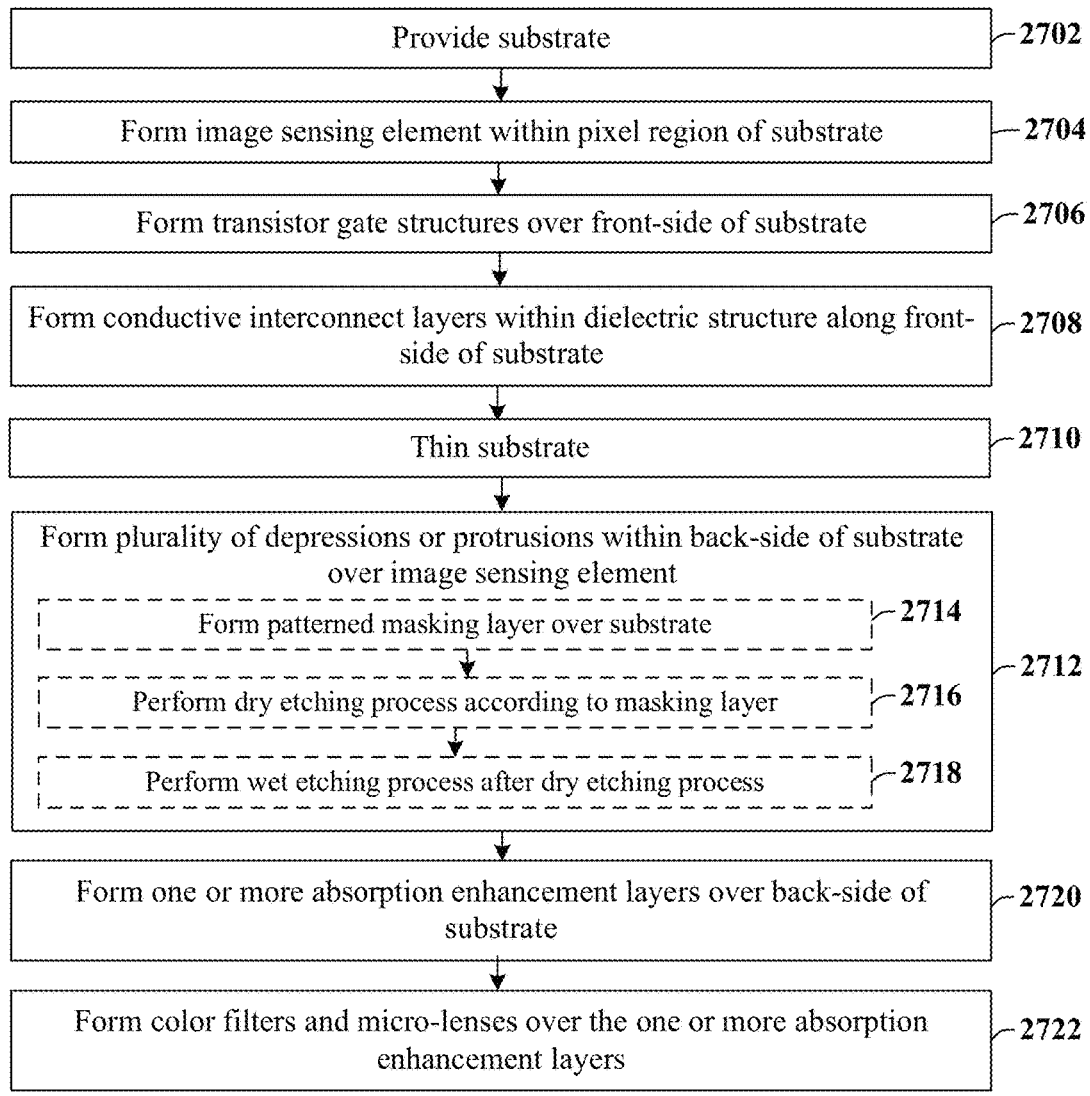
FIG. 27 illustrates a flow diagram of some embodiments of an alternative method of forming a BSI-CIS comprising an absorption enhancement structure.

FIG. 27 illustrates a flow diagram of some embodiments of an alternative method 2700 of forming a BSI-CIS comprising an absorption enhancement structure.

At 2702, a substrate is provided. FIG. 20 illustrates a cross-sectional view 2000 of some embodiments corresponding to act 2702.

At 2704, an image sensing element is formed within a pixel region of a substrate. FIG. 21 illustrates a cross-sectional view 2100 of some embodiments corresponding to act 2704.

At 2706, one or more transistor gate structures for transistor devices are formed along the front-side of the substrate. FIG. 22 illustrates a cross-sectional view 2200 of some embodiments corresponding to act 2706.

At 2708, a plurality of conductive interconnect layer are formed within a dielectric structure arranged along the front-side of the substrate. FIG. 22 illustrates a cross-sectional view 2200 of some embodiments corresponding to act 2708.

At 2710, the substrate is thinned. In some embodiments, the dielectric structure is coupled to a carrier substrate prior to thinning. FIG. 23 illustrates a cross-sectional view 2300 of some embodiments corresponding to act 2710.

At 2712, a plurality of recesses and/or protrusions are formed within a back-side of the substrate at a location overlying the image sensing element. In some embodiments, the plurality of recesses and/or protrusions may be formed by forming a patterned masking layer over the back-side of the substrate at 2714. A dry etching process may be performed with the masking layer in place to form a plurality of intermediate protrusions, at 2716. A wet etching process is subsequently performed after the dry etching process is completed to form a plurality of protrusions from the plurality of intermediate protrusions, at 2718. FIGS. 24-25B illustrates cross-sectional views of some embodiments corresponding to act 2712.

At 2720, one or more absorption enhancement layers are formed over the back-side of the substrate. FIG. 26 illustrates a cross-sectional view 2600 of some embodiments corresponding to act 2720.

At 2722, color filters and micro-lenses are formed over the one or more absorption enhancement layers. FIG. 26 illustrates a cross-sectional view 2600 of some embodiments corresponding to act 2722.

Although the disclosed absorption enhancement structure has been described with respect to back-side image sensors, it will be appreciated that the disclosed absorption enhancement structure is not limited to such image sensors. For example, in various embodiments, the disclosed absorption enhancement structure may be used in back-side image sensors or in front-side image sensors.

The present disclosure relates to a method of forming an absorption enhancement structure that improves a quantum efficiency (QE) of an integrated chip image sensor, and an associated apparatus. The method uses a dry etching process and a wet etching process to reduce crystalline defects resulting from the formation of the absorption enhancement structure.

In some embodiments, the present disclosure relates to a method of forming an absorption enhancement structure for an image sensor integrated chip. The method comprises forming a patterned masking layer over a first side of a substrate, and performing a dry etching process on the first side of the substrate according to the patterned masking layer to define a plurality of intermediate protrusions arranged along the first side of the substrate. The method further comprises performing a wet etching process on the plurality of intermediate protrusions to form a plurality of protrusions, and forming one or more absorption enhancement layers over and between the plurality of protrusions.

In other embodiments, the present disclosure relates to a method of forming an image sensor. The method comprises forming an image sensing element within a substrate, and forming a patterned masking layer on a first side of the substrate at a location over the image sensing element. The method further comprises performing a dry etching process on the first side of the substrate according to the patterned masking layer to define a plurality of intermediate protrusions. The method further comprises performing a wet etching process on the plurality of intermediate protrusions to form a plurality of protrusions. The method further comprises forming a dielectric material over the plurality of protrusions, and performing a planarization process on the dielectric material.

In yet other embodiments, the present disclosure relates an image sensor integrated chip. The image sensor integrated chip comprises an image sensing element arranged within a substrate, and a plurality of protrusions arranged along a first side of the substrate over the image sensing element. The image sensor integrated chip further comprises one or more absorption enhancement layers arranged over and between the plurality of protrusions. The plurality of protrusions respectively comprise a sidewall having a first segment having a first sidewall angle and a second segment overlying the first segment and having a second sidewall angle that is larger than the first sidewall angle. The first sidewall angle and the second sidewall angle are acute angles measured with respect to a plane extending along bottoms of the plurality of protrusions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming an image sensing element within a substrate;
   performing a dry etching process on the substrate to form a plurality of intermediate protrusions defined by the substrate; and
   performing a wet etching process on the plurality of intermediate protrusions to form a plurality of protrusions from the plurality of intermediate protrusions.

2. The method of claim 1, further comprising:
   forming a masking layer over the substrate; and
   performing the dry etching process on the substrate according to the masking layer to define the plurality of intermediate protrusions.

3. The method of claim 1, wherein the image sensing element is formed within the substrate prior to performing the dry etching process.

4. The method of claim 1, wherein the image sensing element is formed within the substrate after performing the dry etching process.

5. The method of claim 1,
   wherein a first one of the plurality of protrusions has a flat segment as viewed in a cross-sectional view of the plurality of protrusions; and
   wherein a line that extends along the flat segment intersects an opposing sidewall of the first one of the plurality of protrusions.

6. The method of claim 1,
   wherein a horizontally extending surface having a first width extends between adjacent ones of the plurality of intermediate protrusions; and
   wherein the wet etching process reduces a width of the horizontally extending surface from the first width to a second width smaller than the first width.

7. The method of claim 1,
   wherein the substrate has one or more surfaces extending between a bottom and a top of a first one of the plurality of protrusions; and
   wherein a slope of the one or more surfaces increases from a first point a first distance over the image sensing element to a second point a second distance over the image sensing element, the second distance greater than the first distance.

8. A method of forming an integrated chip, comprising:
   performing a dry etch on a first side of a substrate to define a plurality of intermediate protrusions having sidewalls oriented at a first angle with respect to a horizontal plane that is parallel to a second side of the substrate opposing the first side; and
   performing a second etch on the plurality of intermediate protrusions to reduce an angle of the sidewalls and define a plurality of protrusions.

9. The method of claim 8, further comprising:
   forming a ridge along the first side of the substrate, wherein the ridge has an uppermost surface that is configured to continuously extend in a closed path around the plurality of protrusions.

10. The method of claim 9, wherein a second horizontal plane extends along the uppermost surface of the ridge and is separated from the plurality of protrusions by one or more non-zero distances.

11. The method of claim 9, wherein the ridge has a greater width than a respective one of the plurality of protrusions.

12. The method of claim 9, wherein the ridge has a height that is in a range of between approximately 5% and approximately 15% larger than heights of the plurality of protrusions.

13. The method of claim 8, wherein the dry etch forms a damaged region having crystalline defects along outer edges of the plurality of intermediate protrusions and the second etch removes the damaged region.

14. The method of claim 8, wherein the plurality of protrusions respectively have a height in a range of between approximately 400 nm and approximately 600 nm.

15. A method of forming an integrated chip, comprising:
    forming an image sensing element within a substrate;
    performing a wet etching process to form surfaces of the substrate that define a plurality of protrusions; and
    wherein the surfaces of the substrate define a first one of the plurality of protrusions having a first segment, wherein an imaginary line extending along the first segment intersects an opposing sidewall of the first one of the plurality of protrusions.

16. The method of claim 15, wherein the wet etching process exposes the substrate to tetramethylammonium hydroxide (TMAH).

17. The method of claim 15,
    wherein the substrate comprises a base substrate and an epitaxial layer over the base substrate; and
    wherein the wet etching process forms the surfaces of the substrate that define the plurality of protrusions within the epitaxial layer.

18. The method of claim 15, further comprising:
    forming a dielectric material within recesses between the plurality of protrusions.

19. The method of claim 18, further comprising:
    performing a planarization process to remove part of the dielectric material from over the plurality of protrusions.

20. The method of claim 15, further comprising:
forming a masking layer over the substrate;
performing a dry etching process to etch the substrate according to the masking layer and define a plurality of intermediate protrusions;
removing the masking layer after defining the plurality of intermediate protrusions; and
performing the wet etching process on the plurality of intermediate protrusions to form the plurality of protrusions.

* * * * *